United States Patent
Miyanaga et al.

(10) Patent No.: US 10,262,844 B2
(45) Date of Patent: Apr. 16, 2019

(54) OXIDE SINTERED BODY AND METHOD FOR MANUFACTURING THE SAME, SPUTTERING TARGET, AND SEMICONDUCTOR DEVICE

(71) Applicant: Sumitomo Electric Industries, Ltd., Osaka-shi (JP)

(72) Inventors: Miki Miyanaga, Itami (JP); Hideaki Awata, Itami (JP); Kenichi Watatani, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 134 days.

(21) Appl. No.: 15/122,448

(22) PCT Filed: Oct. 15, 2015

(86) PCT No.: PCT/JP2015/079160
§ 371 (c)(1),
(2) Date: Aug. 30, 2016

(87) PCT Pub. No.: WO2016/129146
PCT Pub. Date: Aug. 18, 2016

(65) Prior Publication Data
US 2017/0069474 A1    Mar. 9, 2017

(30) Foreign Application Priority Data
Feb. 13, 2015  (JP) ................. 2015-026251

(51) Int. Cl.
*H01L 29/38* (2006.01)
*H01J 37/34* (2006.01)
(Continued)

(52) U.S. Cl.
CPC .......... *H01J 37/3429* (2013.01); *C04B 35/01* (2013.01); *C04B 35/6261* (2013.01);
(Continued)

(58) Field of Classification Search
CPC ...................................................... H01B 1/08
See application file for complete search history.

(56) References Cited

U.S. PATENT DOCUMENTS

| | | | |
|---|---|---|---|
| 9,543,444 B2 | 1/2017 | Kishimoto et al. | |
| 2004/0040414 A1 | 3/2004 | Abe | |

(Continued)

FOREIGN PATENT DOCUMENTS

| | | |
|---|---|---|
| CN | 1690011 A | 11/2005 |
| CN | 102460712 A | 5/2012 |

(Continued)

OTHER PUBLICATIONS

International Search Report in PCT International Application No. PCT/JP2015/060969, dated Jun. 30, 2015.

(Continued)

*Primary Examiner* — William D Young
(74) *Attorney, Agent, or Firm* — Baker Botts L.L.P.; Michael A. Sartori

(57) ABSTRACT

There is provided an oxide sintered body including indium, tungsten and zinc, wherein the oxide sintered body includes a bixbite type crystal phase as a main component and has an apparent density of higher than 6.6 g/cm$^3$ and equal to or lower than 7.5 g/cm$^3$, a content rate of tungsten to a total of indium, tungsten and zinc in the oxide sintered body is higher than 0.5 atomic % and equal to or lower than 5.0 atomic %, a content rate of zinc to the total of indium, tungsten and zinc in the oxide sintered body is equal to or higher than 1.2 atomic % and equal to or lower than 19 atomic %, and an atomic ratio of zinc to tungsten is higher than 1.0 and lower than 60. There are also provided a sputtering target including this oxide sintered body, and a semiconductor device.

2 Claims, 5 Drawing Sheets

(51) Int. Cl.
  *C04B 35/01* (2006.01)
  *C04B 35/626* (2006.01)
  *C23C 14/34* (2006.01)
  *H01L 29/22* (2006.01)
  *C23C 16/40* (2006.01)

(52) U.S. Cl.
  CPC .... *C04B 35/62645* (2013.01); *C23C 14/3414* (2013.01); *C23C 16/40* (2013.01); *H01J 37/3491* (2013.01); *H01L 29/22* (2013.01); *C04B 2235/326* (2013.01); *C04B 2235/3258* (2013.01); *C04B 2235/3284* (2013.01); *C04B 2235/3286* (2013.01); *C04B 2235/5436* (2013.01); *C04B 2235/5445* (2013.01); *C04B 2235/602* (2013.01); *C04B 2235/76* (2013.01); *C04B 2235/767* (2013.01); *C04B 2235/77* (2013.01); *C04B 2235/80* (2013.01); *H01J 2237/332* (2013.01)

(56) References Cited

U.S. PATENT DOCUMENTS

| | | |
|---|---|---|
| 2005/0239660 A1 | 10/2005 | Abe et al. |
| 2006/0099140 A1 | 5/2006 | Abe |
| 2007/0126344 A1 | 6/2007 | Ohashi et al. |
| 2007/0170434 A1 | 7/2007 | Inoue et al. |
| 2008/0191204 A1 | 8/2008 | Kim et al. |
| 2010/0025680 A1 | 2/2010 | Shino et al. |
| 2010/0276688 A1 | 11/2010 | Yano et al. |
| 2011/0042669 A1 | 2/2011 | Kim et al. |
| 2011/0168994 A1 | 7/2011 | Kawashima et al. |
| 2011/0240935 A1 | 10/2011 | Yano et al. |
| 2012/0037897 A1 | 2/2012 | Shiino et al. |
| 2013/0299753 A1 | 11/2013 | Nakayama |
| 2015/0279943 A1* | 10/2015 | Nakayama .......... H01L 29/24 257/43 |
| 2016/0251264 A1 | 9/2016 | Miyanaga et al. |
| 2017/0012133 A1 | 1/2017 | Miyanaga et al. |
| 2017/0029933 A1 | 2/2017 | Miyanaga et al. |
| 2017/0062620 A1 | 3/2017 | Yamazaki et al. |
| 2017/0069474 A1 | 3/2017 | Miyanaga et al. |

FOREIGN PATENT DOCUMENTS

| | | |
|---|---|---|
| EP | 1 734 150 A1 | 12/2006 |
| EP | 2421048 A1 | 2/2012 |
| EP | 2 980 041 A1 | 2/2016 |
| JP | 2002-275623 A | 9/2002 |
| JP | 2004-091265 A | 3/2004 |
| JP | 2005-314131 A | 11/2005 |
| JP | 2006-022373 A | 1/2006 |
| JP | 2006-160535 A | 6/2006 |
| JP | 2006-188392 A | 7/2006 |
| JP | 2006-193363 A | 7/2006 |
| JP | 2006-347807 A | 12/2006 |
| JP | 2007-153702 A | 6/2007 |
| JP | 2008-192721 A | 8/2008 |
| JP | 2008-199005 A | 8/2008 |
| JP | 2010-251604 A | 11/2010 |
| JP | 2013-001590 A | 1/2013 |
| JP | 2013-173658 A | 9/2013 |
| JP | 2013-184840 A | 9/2013 |
| KR | 10-2006-0046691 A | 5/2006 |
| WO | 2012/105323 A1 | 8/2012 |
| WO | WO-2014/058019 A1 | 4/2014 |
| WO | WO-2015/146745 A1 | 10/2015 |

OTHER PUBLICATIONS

Extended European Search Report in counterpart European Patent Application No. 15851758.1, dated Nov. 14, 2016.
Notice of Grounds of Rejection in counterpart Japanese Patent Application No. 2014-215468, dated Dec. 20, 2016.
U.S. Appl. No. 15/100,174, filed May 27, 2016.
Non-Final Office Action issued in U.S. Appl. No. 15/100,174, dated Jul. 27, 2017.
Luo et al "Upconversion luminescence properties of Li doped ZnWO4:Yb,Er", J. Mater. Res. vol. 23, No. 8, Aug 2008 (pp. 2078-2083).
Restriction Requirement issued in U.S. Appl. No. 14/787,751, dated May 15, 2017.
Notice of Allowance issued in U.S. Appl. No. 14/787,751, dated Nov. 1, 2017.
Notification of First Office Action in Chinese Patent Application No. 201580000813.3, dated Jun. 2, 2016.
Grounds for Rejection in counterpart Korean Patent Application No. 10-2015-7032831, dated Sep. 22, 2016.
Extended European Search Report in counterpart European Patent Application No. 15768922.5, dated Dec. 13, 2016.
International Search Report in International Application No. PCT/JP2015/058061, dated Jun. 16, 2015.
U.S. Appl. No. 14/787,751, filed Oct. 28, 2015.
Notice of Allowance issued in U.S. Appl. No. 15/100,174, dated May 18, 2018.
U.S. Appl. No. 15/928,769, filed Mar. 22, 2018.
Office Action issued in U.S. Appl. No. 15/100,174, dated Feb. 1, 2018.
International Search Report in International Application No. PCT/JP2015/079160, dated Dec. 8, 2015.
Notice of Allowance issued in U.S. Appl. No. 14/787,751, dated Dec. 28, 2017.
Non-Final Office Action issued in U.S. Appl. No. 14/787,751, dated Jul. 27, 2017.

* cited by examiner

OXIDE SINTERED BODY AND METHOD FOR MANUFACTURING THE SAME, SPUTTERING TARGET, AND SEMICONDUCTOR DEVICE

TECHNICAL FIELD

The present invention relates to an oxide sintered body that can be suitably used as a sputtering target for forming an oxide semiconductor film by a sputtering method, a method for manufacturing the oxide sintered body, a sputtering target including the oxide sintered body, and a semiconductor device including the oxide semiconductor film formed by the sputtering method with the sputtering target.

BACKGROUND ART

In a liquid crystal display device, a thin-film EL (electroluminescence) display device, an organic EL display device or the like, an amorphous silicon (a-Si) film has been conventionally mainly used as a semiconductor film that functions as a channel layer of a TFT (thin-film transistor) which is a semiconductor device.

In recent years, attention has been focused on a composite oxide including indium (In), gallium (Ga) and zinc (Zn), i.e., an In—Ga—Zn-based composite oxide (also referred to as "IGZO"), as an alternative material to a-Si. A higher carrier mobility can be expected in an IGZO-based oxide semiconductor as compared with a-Si.

For example, Japanese Patent Laying-Open No. 2008-199005 (PTD 1) discloses that an oxide semiconductor film mainly composed of IGZO is formed by a sputtering method by using an oxide sintered body as a target.

Japanese Patent Laying-Open No. 2008-192721 (PTD 2) discloses an oxide sintered body including indium and tungsten (W), as a material suitably used when forming an oxide semiconductor film by the sputtering method and the like.

In addition, as a material suitably used when forming an oxide transparent electroconductive film by a vacuum vapor deposition method such as an electron beam vapor deposition method, an ion plating method and a high-density plasma-assisted vapor deposition method, Japanese Patent Laying-Open No. 2006-347807 (PTD 3) discloses an oxide sintered body including indium oxide having W solid-dissolved therein, including W with a ratio of atomic number of W to In being equal to or higher than 0.001 and equal to or lower than 0.034, and having a density (apparent density) of equal to or higher than 4.0 g/cm$^3$ and equal to or lower than 6.5 g/cm$^3$.

CITATION LIST

Patent Document

PTD 1: Japanese Patent Laying-Open No. 2008-199005
PTD 2: Japanese Patent Laying-Open No. 2008-192721
PTD 3: Japanese Patent Laying-Open No. 2006-347807

SUMMARY OF INVENTION

Technical Problem

A TFT including the IGZO-based oxide semiconductor film described in PTD 1 as a channel layer has a problem that a field-effect mobility is low, i.e., approximately 10 cm$^2$/Vs.

In addition, PTD 2 proposes a TFT including, as a channel layer, the oxide semiconductor film formed by using the oxide sintered body including In and W. However, the reliability of the TFT is not studied.

The oxide sintered body described in PTD 3 has a problem that the density (apparent density) is low, i.e., equal to or lower than 6.5 g/cm$^3$, and thus, the oxide sintered body cannot be used as a sputtering target for the sputtering method which is an optimum method for forming the oxide semiconductor film.

Thus, an object of the present invention is to provide an oxide sintered body that can be suitably used as a sputtering target for forming, by the sputtering method, an oxide semiconductor film of a semiconductor device that can achieve both high field-effect mobility and high reliability, a method for manufacturing the oxide sintered body, a sputtering target including the oxide sintered body, and a semiconductor device including the oxide semiconductor film formed by the sputtering method with the sputtering target.

Solution to Problem

An oxide sintered body according to one aspect of the present invention is an oxide sintered body including indium, tungsten and zinc, wherein the oxide sintered body includes a bixbite type crystal phase as a main component and has an apparent density of higher than 6.6 g/cm$^3$ and equal to or lower than 7.5 g/cm$^3$, a content rate of tungsten to a total of indium, tungsten and zinc in the oxide sintered body is higher than 0.5 atomic % and equal to or lower than 5.0 atomic %, a content rate of zinc to the total of indium, tungsten and zinc in the oxide sintered body is equal to or higher than 1.2 atomic % and equal to or lower than 19 atomic %, and an atomic ratio of zinc to tungsten is higher than 1.0 and lower than 60.

A sputtering target according to another aspect of the present invention includes the oxide sintered body according to the aforementioned aspect.

A semiconductor device according to still another aspect of the present invention includes an oxide semiconductor film formed by a sputtering method with the sputtering target according to the aforementioned aspect.

A method for manufacturing an oxide sintered body according to a further aspect of the present invention is a method for manufacturing the oxide sintered body according to the aforementioned aspect, the method including: preparing a primary mixture of an indium oxide powder and a tungsten oxide powder; forming a calcined powder by heat-treating the primary mixture; preparing a secondary mixture of raw material powders, wherein the secondary mixture includes the calcined powder; forming a molded body by molding the secondary mixture; and forming the oxide sintered body by sintering the molded body, wherein forming a calcined powder includes forming a complex oxide powder including indium and tungsten as the calcined powder by heat-treating the primary mixture at a temperature equal to or higher than 700° C. and lower than 1200° C. under an oxygen-containing atmosphere.

A method for manufacturing an oxide sintered body according to a further aspect of the present invention is a method for manufacturing the oxide sintered body according to the aforementioned aspect, the method including: preparing a primary mixture of a zinc oxide powder and a tungsten oxide powder; forming a calcined powder by heat-treating the primary mixture; preparing a secondary mixture of raw material powders, wherein the secondary mixture includes the calcined powder; forming a molded body by molding the secondary mixture; and forming the oxide sintered body by sintering the molded body, wherein forming a calcined powder includes forming a complex oxide powder including zinc and tungsten as the calcined powder by heat-treating the primary mixture at a temperature equal to or higher than 550° C. and lower than 1200° C. under an oxygen-containing atmosphere.

Advantageous Effects of Invention

According to the foregoing, there can be provided an oxide sintered body that can be suitably used as a sputtering target for forming, by the sputtering method, an oxide semiconductor film of a semiconductor device that can achieve both high field-effect mobility and high reliability, a method for manufacturing the oxide sintered body, a sputtering target including the oxide sintered body, and a semiconductor device including the oxide semiconductor film formed by the sputtering method with the sputtering target.

BRIEF DESCRIPTION OF DRAWINGS

FIG. 1 is a schematic view showing one example of a semiconductor device according to one aspect of the present invention, in which FIG. 1(A) shows a schematic plan view and FIG. 1(B) shows a schematic cross-sectional view taken along line IB-IB shown in FIG. 1(A).

DESCRIPTION OF EMBODIMENTS

Figure 1:
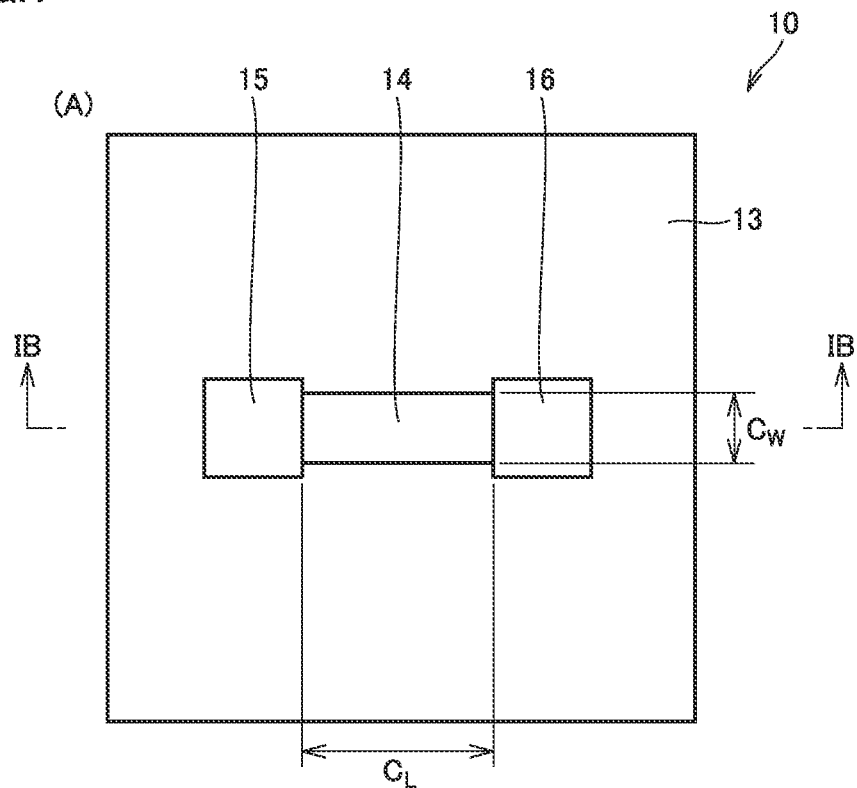
Figure 1:
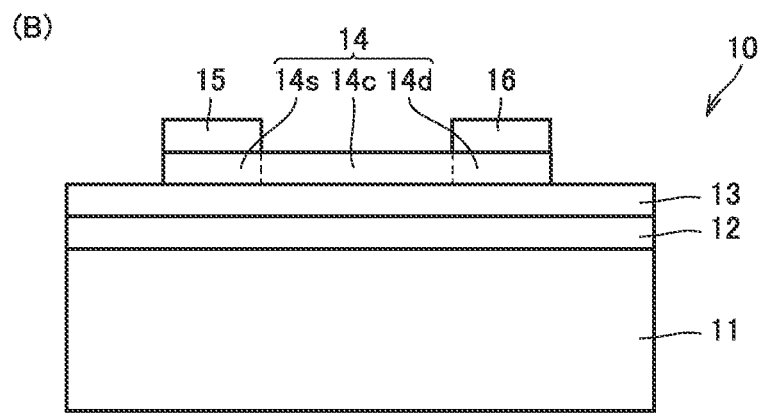

<Description of Embodiments of the Present Invention>

First, embodiments of the present invention will be listed and described.

[1] An oxide sintered body according to one aspect of the present invention is an oxide sintered body including indium (In), tungsten (W) and zinc (Zn), wherein the oxide sintered body includes a bixbite type crystal phase as a main component and has an apparent density of higher than 6.6 g/cm$^3$ and equal to or lower than 7.5 g/cm$^3$. Therefore, the oxide sintered body of the present embodiment can be suitably used as a sputtering target for forming an oxide semiconductor film of a semiconductor device having high field-effect mobility and reliability by a sputtering method.

In the oxide sintered body of the present embodiment, a content rate of W to a total of In, W and Zn in the oxide sintered body is higher than 0.5 atomic % and equal to or lower than 5.0 atomic %, a content rate of Zn to the total of In, W and Zn in the oxide sintered body is equal to or higher than 1.2 atomic % and equal to or lower than 19 atomic %, and an atomic ratio of Zn to W is higher than 1.0 and lower than 60. As a result, in the semiconductor device including, as a channel layer, the oxide semiconductor film formed by using the sputtering target including the aforementioned oxide sintered body, the field-effect mobility can be increased and the reliability can also be increased.

[2] In the oxide sintered body of the present embodiment, the bixbite type crystal phase may include indium oxide as a main component, and include at least one of W and Zn solid-dissolved in at least a part of the bixbite type crystal phase. This is advantageous in increasing the field-effect mobility and the reliability in the semiconductor device including, as a channel layer, the oxide semiconductor film formed by using the sputtering target including the aforementioned oxide sintered body.

[3] The oxide sintered body of the present embodiment may further include a hexagonal wurtz type crystal phase. This is advantageous in increasing the field-effect mobility and the reliability in the semiconductor device including, as a channel layer, the oxide semiconductor film formed by using the sputtering target including the aforementioned oxide sintered body.

[4] The oxide sintered body of the present embodiment may further include a zinc tungstate compound crystal phase. This is advantageous in increasing the field-effect mobility and the reliability in the semiconductor device including, as a channel layer, the oxide semiconductor film formed by using the sputtering target including the aforementioned oxide sintered body.

[5] A sputtering target which is another embodiment of the present invention includes the oxide sintered body of the aforementioned embodiment. Since the sputtering target of the present embodiment includes the oxide sintered body of the aforementioned embodiment, the sputtering target of the present embodiment can be suitably used to form an oxide semiconductor film of a semiconductor device having high field-effect mobility and reliability by a sputtering method.

[6] The semiconductor device which is still another embodiment of the present invention includes an oxide semiconductor film formed by a sputtering method with the sputtering target of the aforementioned embodiment. Since the semiconductor device of the present embodiment includes an oxide semiconductor film formed by a sputtering method with the sputtering target of the aforementioned embodiment, the semiconductor device of the present embodiment can exhibit high field-effect mobility and reliability. Although the semiconductor device described herein is not particularly limited, a TFT (thin-film transistor) including, as a channel layer, the oxide semiconductor film formed by the sputtering method with the sputtering target of the aforementioned embodiment is a suitable example.

[7] In the semiconductor device of the present embodiment, a content rate of W to a total of In, W and Zn in the oxide semiconductor film may be higher than 0.5 atomic % and equal to or lower than 5.0 atomic %, a content rate of Zn to the total of In, W and Zn in the oxide semiconductor film may be equal to or higher than 1.2 atomic % and equal to or lower than 19 atomic %, and a value of an atomic ratio of Zn to W may be higher than 1.0 and lower than 60. This is advantageous in increasing the field-effect mobility and the reliability in the semiconductor device including the oxide semiconductor film as a channel layer.

[8] In the semiconductor device of the present embodiment, the oxide semiconductor film preferably has an electric resistivity of equal to or higher than $10^{-1}$ Ωcm. Until now, many transparent electroconductive films including indium oxide have been studied. However, in the applications of these transparent electroconductive films, the electric resistivity lower than $10^{-1}$ Ωcm has been required. The oxide semiconductor film of the semiconductor device of the present embodiment preferably has an electric resistivity of equal to or higher than $10^{-1}$ Ωcm, and thus, the oxide semiconductor film can be suitably used as a channel layer of the semiconductor device. When the electric resistivity is lower than $10^{-1}$ Ωcm, it is difficult to use the oxide semiconductor film as a channel layer of the semiconductor device.

[9] In the semiconductor device of the present embodiment, the oxide semiconductor film may be composed of nanocrystalline oxide or amorphous oxide. This is advantageous in increasing the field-effect mobility and the reliability in the semiconductor device including the oxide semiconductor film as a channel layer.

[10] In the semiconductor device of the present embodiment, the oxide semiconductor film may have a film thickness of equal to or greater than 2 nm and equal to or smaller than 25 nm. This is advantageous in increasing the field-effect mobility and the reliability in the semiconductor device including the oxide semiconductor film as a channel layer.

[11] The semiconductor device according to the present embodiment may further include a layer arranged to be in contact with at least a part of the oxide semiconductor film. In this case, the layer may be at least one of a nanocrystalline layer and an amorphous layer. Further inclusion of the layer is advantageous in increasing the field-effect mobility and the reliability in the semiconductor device including the oxide semiconductor film as a channel layer.

[12] In the semiconductor device according to the present embodiment, the layer arranged to be in contact with at least a part of the oxide semiconductor film may be an oxide layer including at least one of silicon (Si) and aluminum (Al). The feature that the layer is an oxide layer including at least one of Si and Al is advantageous in increasing the field-effect mobility and the reliability in the semiconductor device including the oxide semiconductor film as a channel layer.

[13] A method for manufacturing an oxide sintered body which is a further embodiment of the present invention is a method for manufacturing the oxide sintered body of the aforementioned embodiment, the method including: preparing a primary mixture of an indium oxide powder and a tungsten oxide powder; forming a calcined powder by heat-treating the primary mixture; preparing a secondary mixture of raw material powders, wherein the secondary mixture includes the calcined powder; forming a molded body by molding the secondary mixture; and forming the oxide sintered body by sintering the molded body, wherein forming a calcined powder includes forming a complex oxide powder including In and W as the calcined powder by heat-treating the primary mixture at a temperature equal to or higher than 700° C. and lower than 1200° C. under an oxygen-containing atmosphere. According to the method for manufacturing the oxide sintered body of the present embodiment, an apparent density of the oxide sintered body is increased and the oxide sintered body that can be suitably used as a sputtering target is obtained. In addition, by sintering the molded body in an air atmosphere of atmospheric pressure, an electric resistivity of the oxide sintered body can be set to be equal to or lower than 1 Ωcm, and the oxide sintered body that can be suitably used as a sputtering target is obtained.

[14] A method for manufacturing an oxide sintered body which is a further embodiment of the present invention is a method for manufacturing the oxide sintered body of the aforementioned embodiment, the method including: preparing a primary mixture of a zinc oxide powder and a tungsten oxide powder; forming a calcined powder by heat-treating the primary mixture; preparing a secondary mixture of raw material powders, wherein the secondary mixture includes the calcined powder; forming a molded body by molding the secondary mixture; and forming the oxide sintered body by sintering the molded body, wherein forming a calcined powder includes forming a complex oxide powder including Zn and W as the calcined powder by heat-treating the primary mixture at a temperature equal to or higher than 550° C. and lower than 1200° C. under an oxygen-containing atmosphere. According to the method for manufacturing the oxide sintered body of the present embodiment, an apparent density of the oxide sintered body is increased and the oxide sintered body that can be suitably used as a sputtering target is obtained. In addition, by sintering the molded body in an air atmosphere of atmospheric pressure, an electric resistivity of the oxide sintered body can be set to be equal to or lower than 1 Ωcm, and the oxide sintered body that can be suitably used as a sputtering target is obtained.

[15] In the method for manufacturing the oxide sintered body of the aforementioned embodiment, the tungsten oxide powder may include at least one type of crystal phase selected from the group consisting of a $WO_3$ crystal phase, a $WO_2$ crystal phase and a $WO_{2.72}$ crystal phase. As a result, an apparent density of the oxide sintered body is increased and the oxide sintered body that can be suitably used as a sputtering target is obtained. In addition, by sintering the molded body in an air atmosphere of atmospheric pressure, an electric resistivity of the oxide sintered body can be set to be equal to or lower than 1 Ωcm, and the oxide sintered body that can be suitably used as a sputtering target is obtained.

[16] In the method for manufacturing the oxide sintered body of the aforementioned embodiment, a median particle size d50 of the tungsten oxide powder may be equal to or larger than 0.1 μm and equal to or smaller than 4 μm. As a result, an apparent density of the oxide sintered body is increased and the oxide sintered body that can be suitably used as a sputtering target is obtained.

[17] In the method for manufacturing the oxide sintered body of the aforementioned embodiment, the complex oxide may include at least one of a $ZnWO_4$ type crystal phase and an $In_6WO_{12}$ type crystal phase. As a result, an apparent density of the oxide sintered body is increased and the oxide sintered body that can be suitably used as a sputtering target is obtained. In addition, by sintering the molded body in an air atmosphere of atmospheric pressure, an electric resistivity of the oxide sintered body can be set to be equal to or lower than 1 Ωcm, and the oxide sintered body that can be suitably used as a sputtering target is obtained.

<Details of Embodiments of the Present Invention>

[First Embodiment: Oxide Sintered Body]

Since the oxide sintered body of the present embodiment is an oxide sintered body including In, W and Zn, wherein the oxide sintered body includes a bixbite type crystal phase as a main component and has an apparent density of higher than 6.6 g/cm$^3$ and equal to or lower than 7.5 g/cm$^3$, the oxide sintered body of the present embodiment is suitably used as a sputtering target for forming an oxide semiconductor film of a semiconductor device having high field-effect mobility and reliability by a sputtering method.

In the present specification, "bixbite type crystal phase" is a generic term for a bixbite crystal phase as well as a phase having the same crystal structure as that of the bixbite crystal phase, in which at least one element of metal elements other than In is included in at least a part of the bixbite crystal phase. The bixbite crystal phase is one of the crystal phases of indium oxide ($In_2O_3$) and refers to a crystal structure defined in 6-0416 of the JCPDS card, and is also called "rare-earth oxide C type phase (or C-rare earth structure phase)".

The bixbite type crystal phase can be identified by X-ray diffraction. Namely, by the X-ray diffraction, the presence of the bixbite type crystal phase can be identified and lattice spacing can be measured.

In addition, "includes a bixbite type crystal phase as a main component" refers to the case in which a ratio of the bixbite type crystal phase in the oxide sintered body (an occupancy rate of the bixbite type crystal phase described below) is equal to or higher than 60%. The oxide sintered body can include a crystal phase other than the bixbite type crystal phase. From the perspective of increasing the field-effect mobility and the reliability in the semiconductor device including, as a channel layer, the oxide semiconductor film formed by using the sputtering target including the oxide sintered body, the oxide sintered body preferably includes at least one crystal phase selected from a hexagonal wurtz type crystal phase and a zinc tungstate compound crystal phase as the crystal phase other than the bixbite type crystal phase.

In the present specification, "hexagonal wurtz type crystal phase" is a generic term for a hexagonal wurtz crystal phase as well as a phase having the same crystal structure as that of the hexagonal wurtz crystal phase, in which at least one element of metal elements other than Zn is included in at least a part of the hexagonal wurtz crystal phase. The hexagonal wurtz crystal phase is one of the crystal phases of zinc oxide (ZnO) and refers to a crystal structure expressed by a space group of P63mc and a space group of No.: 186 and defined in 01-079-0207 of the JCPDS card.

In addition, in the present specification, "zinc tungstate compound crystal phase" is a crystal phase mainly composed of Zn, W and oxygen (O). Examples of the zinc tungstate compound crystal phase include a $ZnWO_4$ type crystal phase. Here, "$ZnWO_4$ type crystal phase" is a generic term for a $ZnWO_4$ crystal phase as well as a phase having the same crystal structure as that of the $ZnWO_4$ crystal phase, in which at least one element of elements other than Zn and W is included in at least a part of the $ZnWO_4$ crystal phase. The $ZnWO_4$ crystal phase is a zinc tungstate compound crystal phase having a crystal structure expressed by a space group of P12/c1(13) and having a crystal structure defined in 01-088-0251 of the JCPDS card. As long as these crystal systems are exhibited, a lattice constant may vary due to shortage of oxygen or solid-dissolution of metal.

The oxide sintered body may sometimes include the other crystal phases such as an inclusion-unavoidable crystal phase. A method for distinguishing the bixbite type crystal phase, the hexagonal wurtz type crystal phase and the zinc tungstate compound crystal phase from the crystal phases other than these crystal phases is as follows, for example.

First, the presence of the bixbite type crystal phase, the hexagonal wurtz type crystal phase and the zinc tungstate compound crystal phase, and the presence of the crystal phases other than these crystal phases are identified by the X-ray diffraction. In some cases, only the bixbite type crystal phase is identified by the X-ray diffraction. When only the bixbite type crystal phase is identified, it is determined that the bixbite type crystal phase is a main component.

When the presence of the bixbite type crystal phase, the hexagonal wurtz type crystal phase and the zinc tungstate compound crystal phase, and the presence of the crystal phases other than these crystal phases are identified by the X-ray diffraction, the following measurement is performed to check whether or not the bixbite type crystal phase is a main component. First, a sample is obtained from a part of the oxide sintered body and a surface of the sample is polished to make the surface smooth. Then, by using an SEM-EDX (scanning secondary electron microscope with an energy-dispersive X-ray fluorescence spectrometer), the surface of the sample is observed by an SEM (scanning secondary electron microscope) and a composition ratio of the metal elements of the respective crystal particles is analyzed by an EDX (energy-dispersive X-ray fluorescence spectrometer). Then, the crystal particles are grouped based on a tendency of the composition ratio of the metal elements of these crystal particles. Specifically, the crystal particles can be divided into a group A of the crystal particles having a high Zn content rate [a content rate (atomic %) of Zn to a total of In, W and Zn] and having a very low W content rate or not including W, a group B of the crystal particles having a high Zn content rate and a high W content rate [a content rate (atomic %) of W to the total of In, W and Zn], and a group C of the crystal particles having a very low Zn content rate and a very low W content rate and having a high In content rate [a content rate (atomic %) of In to the total of In, W and Zn]. The group A can be concluded as the hexagonal wurtz type crystal phase, the group B can be concluded as the zinc tungstate compound crystal phase, the group C can be concluded as the bixbite type $In_2O_3$ phase, and the other group can be concluded as the other crystal phases.

The occupancy rate of the bixbite type crystal phase in the oxide sintered body (a rate of the bixbite type crystal phase in the oxide sintered body) is defined as a ratio (percentage) of an area of the bixbite type crystal phase (group C) to the aforementioned measured surface of the oxide sintered body. In the oxide sintered body according to the present embodiment including the bixbite type crystal phase as a main component, the occupancy rate of the bixbite type crystal phase in accordance with this definition is equal to or higher than 60%.

The oxide sintered body according to the present embodiment has an apparent density of higher than 6.6 $g/cm^3$ and equal to or lower than 7.5 $g/cm^3$.

Considering that a theoretical density of a bixbite crystal phase made of indium oxide is 7.28 $g/cm^3$, and further assuming that the bixbite type crystal phase (composed of In, W and O) and the hexagonal wurtz type crystal phase (composed of Zn and O) are mixedly present in the oxide sintered body, a theoretical density of the bixbite type crystal phase which is the main component of the oxide sintered body according to the present embodiment is minimized when the content rate of W to the total of In, W and Zn (W content rate) is 0.5 atomic % and the content rate of Zn to the total of In, W and Zn (Zn content rate) is 19 atomic %, and the theoretical density at this time is calculated as 6.99 $g/cm^3$, because the W content rate is higher than 0.5 atomic % and equal to or lower than 5.0 atomic %, the Zn content rate is equal to or higher than 1.2 atomic % and equal to or lower than 19 atomic %, and the atomic ratio of Zn to W (Zn/W ratio) is higher than 1.0 and lower than 60 in the present embodiment. On the other hand, the theoretical density is maximized when the W content rate is 5 atomic % and the Zn content rate is 5 atomic %, and the theoretical density at this time is calculated as 7.3 $g/cm^3$.

When the oxide sintered body is formed of the bixbite crystal phase (composed of In and O), the hexagonal wurtz type crystal phase (composed of Zn and O) and the $ZnWO_4$ crystal phase (composed of Zn, W and O), a theoretical density of the $ZnWO_4$ crystal phase is high, i.e., 7.8 $g/cm^3$, and it is conceivable that the theoretical density is the highest when this ratio is the highest. When the W content rate is 5 atomic % which is the possible maximum value and the Zn content rate is 5 atomic % which is the same as the W content rate, the theoretical density of the oxide sintered body shows the highest value. In this case, the theoretical density is 7.5 g/cm$^3$.

In the oxide sintered body according to the present embodiment, a relative density (relative density/theoretical density), which is a ratio of the apparent density to the aforementioned theoretical density, is preferably equal to or higher than 94%.

In the case of using the oxide sintered body as the sputtering target, a higher apparent density of the oxide sintered body is considered to be desirable. A low apparent density of the oxide sintered body means that there are many vacancies in the oxide sintered body. During use of the sputtering target, a surface thereof is etched by an argon ion. Therefore, if there are vacancies in the oxide sintered body, these vacancies are exposed and the internal gas is released during film formation, and thus, the gas released from the target enters a deposited oxide semiconductor thin film and the film characteristics are degraded. Furthermore, if the apparent density of the oxide sintered body is low, it is known that an insulator of indium called "nodule" is generated on the target at the time of film formation and thus good sputter discharge is inhibited. From this perspective as well, it is desired to increase the apparent density of the oxide sintered body.

As described above, the oxide sintered body according to the present embodiment having an apparent density of higher than 6.6 g/cm$^3$ and equal to or lower than 7.5 g/cm$^3$ can be suitably used as the sputtering target for forming the oxide semiconductor film used in the semiconductor device having high field-effect mobility and reliability by the sputtering method.

In the oxide sintered body according to the present embodiment, the content rate of W to the total of In, W and Zn in the oxide sintered body (W content rate in the oxide sintered body) is higher than 0.5 atomic % and equal to or lower than 5.0 atomic %, the content rate of Zn to the total of In, W and Zn in the oxide sintered body (Zn content rate in the oxide sintered body) is equal to or higher than 1.2 atomic % and equal to or lower than 19 atomic %, and the atomic ratio of Zn to W in the oxide sintered body (Zn/W ratio in the oxide sintered body) is higher than 1.0 and lower than 60. According to this oxide sintered body, in the semiconductor device (e.g., a TFT) including, as a channel layer, the oxide semiconductor film formed by using the sputtering target including the oxide sintered body, the field-effect mobility can be increased and the reliability can also be increased.

From the perspective of increasing the field-effect mobility and the reliability, the W content rate in the oxide sintered body is preferably equal to or higher than 0.6 atomic %, and preferably equal to or lower than 3 atomic %, and more preferably equal to or lower than 2 atomic %. If the W content rate in the oxide sintered body is equal to or lower than 0.5 atomic %, the reliability decreases in the semiconductor device including, as a channel layer, the oxide semiconductor film formed by using the oxide sintered body. If the W content rate in the oxide sintered body exceeds 5 atomic %, the field-effect mobility decreases in the semiconductor device including, as a channel layer, the oxide semiconductor film formed by using the sputtering target including the oxide sintered body.

If the Zn content rate in the oxide sintered body is equal to or higher than 1.2 atomic % and equal to or lower than 19 atomic %, and the Zn/W ratio in the oxide sintered body is higher than 1.0 and lower than 60, the field-effect mobility can be increased and the reliability can also be increased in the semiconductor device including, as a channel layer, the oxide semiconductor film formed by using the oxide sintered body.

From the perspective of increasing the field-effect mobility and the reliability, the Zn content rate in the oxide sintered body is preferably equal to or higher than 3 atomic %, and more preferably equal to or higher than 10 atomic %, and preferably equal to or lower than 18 atomic %. From the perspective of increasing the field-effect mobility, an In/(In+Zn) atomic ratio is desirably higher than 0.8.

If the Zn content rate in the oxide sintered body is lower than 1.2 atomic %, the reliability decreases in the semiconductor device including, as a channel layer, the oxide semiconductor film formed by using the oxide sintered body. If the Zn content rate in the oxide sintered body exceeds 19 atomic %, the field-effect mobility decreases in the semiconductor device including, as a channel layer, the oxide semiconductor film formed by using the sputtering target including the oxide sintered body.

If the Zn/W ratio in the oxide sintered body is equal to or lower than 1.0, the reliability decreases in the semiconductor device including, as a channel layer, the oxide semiconductor film formed by using the oxide sintered body. The Zn/W ratio is preferably equal to or higher than 3.0, and more preferably equal to or higher than 5.0. If the Zn/W ratio in the oxide sintered body is equal to or higher than 60, the field-effect mobility decreases in the semiconductor device including, as a channel layer, the oxide semiconductor film formed by using the sputtering target including the oxide sintered body. The Zn/W ratio is preferably equal to or lower than 20, and more preferably equal to or lower than 15.

Generally, the reliability of an oxide semiconductor varies with the temperature of heating treatment during manufacturing of a semiconductor device. The reliability can be increased by raising the temperature of heating treatment. However, when the heating treatment temperature is raised in the oxide semiconductor including In, W and Zn, the field-effect mobility decreases. Therefore, it has been desired that the field-effect mobility does not decrease even when the heating treatment temperature is high. In the present specification, high field-effect mobility and high reliability mean that the field-effect mobility does not decrease even when the heating treatment temperature is high, and high reliability is obtained due to high heating treatment temperature.

In the oxide sintered body according to the present embodiment, it is preferable that the bixbite type crystal phase includes indium oxide as a main component, and includes at least one of tungsten and zinc solid-dissolved in at least a part of the bixbite type crystal phase. According to this oxide sintered body, in the semiconductor device (e.g., a TFT) including, as a channel layer, the oxide semiconductor film formed by using the sputtering target including the oxide sintered body, the field-effect mobility and the reliability can be increased more effectively.

In the oxide sintered body according to the present embodiment, "the bixbite type crystal phase includes indium oxide as a main component, and at least one of tungsten and zinc is solid-dissolved in at least a part thereof" refers to a configuration in which at least one of W and Zn is solid-dissolved in a substitutional-type manner in at least a part of a crystal lattice of indium oxide having the bixbite crystal phase, or a configuration in which at least one of W and Zn is solid-dissolved in an interstitial-type manner in between the crystal lattices, or a configuration in which at least one of W and Zn is solid-dissolved in both a substitutional-type manner and an interstitial-type manner.

In the oxide sintered body according to the present embodiment, when at least one of W and Zn is solid-dissolved in at least a part of the bixbite type crystal phase, the lattice spacing is wider or narrower than the lattice spacing defined in 6-0416 of the JCPDS card. In the X-ray diffraction, a peak position is shifted toward the high-angle side or shifted toward the low-angle side. When this peak shift is seen and the presence of a region where In and at least one of W and Zn are mixedly present is seen by surface analysis with the SEM-EDX (scanning secondary electron microscope with an energy-dispersive X-ray fluorescence spectrometer) or TEM-EDX (transmission secondary electron microscope with an energy-dispersive X-ray fluorescence spectrometer), it is conceivable that at least one of W and Zn is solid-dissolved in the bixbite type crystal phase.

Alternatively, when the presence of at least one of W and Zn is seen together with In as a result of identification of the present elements with the ICP (inductively-coupled plasma) mass spectrometry, the SEM-EDX or the other element identification methods, while an oxide of at least one of W and Zn is not seen in the X-ray diffraction, it can also be determined that at least one of W and Zn is solid-dissolved in the bixbite type crystal phase.

Similarly, the hexagonal wurtz type crystal phase includes zinc oxide as a main component, and at least one of W and In may be solid-dissolved in a substitutional-type manner or in an interstitial-type manner in at least a part thereof. To identify this, the X-ray diffraction, the SEM-EDX and the TEM-EDX can be used, similarly to the method for identifying "the bixbite type crystal phase includes indium oxide as a main component, and at least one of W and Zn is solid-dissolved in at least a part thereof" as described above.

Similarly, the zinc tungstate compound crystal phase includes Zn, W and O as main components, and In may be solid-dissolved in a substitutional-type manner or in an interstitial-type manner in at least a part thereof. To identify this, the X-ray diffraction, the SEM-EDX and the TEM-EDX can be used, similarly to the method for identifying "the bixbite type crystal phase includes indium oxide as a main component, and at least one of W and Zn is solid-dissolved in at least a part thereof" as described above.

As the crystals constituting the oxide sintered body, the bixbite type crystal phase is included as a main component, and the hexagonal wurtz type crystal phase and/or the zinc tungstate compound crystal phase are included. Therefore, the field-effect mobility and the reliability can be increased more effectively in the semiconductor device including, as a channel layer, the oxide semiconductor film formed by using the sputtering target including the oxide sintered body.

A content rate of unavoidable metals other than In, W and Zn to the total of In, W and Zn in the oxide sintered body is preferably equal to or lower than 1 atomic %.

[Second Embodiment: Method for Manufacturing Oxide Sintered Body]

One method for manufacturing the oxide sintered body according to the present embodiment is a method for manufacturing the oxide sintered body according to the first embodiment, the method including: preparing a primary mixture of a zinc oxide powder and a tungsten oxide powder; forming a calcined powder by heat-treating the primary mixture; preparing a secondary mixture of raw material powders, wherein the secondary mixture includes the calcined powder; forming a molded body by molding the secondary mixture; and forming the oxide sintered body by sintering the molded body. Forming a calcined powder includes forming a complex oxide powder including Zn and W as the calcined powder by heat-treating the primary mixture at a temperature equal to or higher than 550° C. and lower than 1200° C. under an oxygen-containing atmosphere.

According to the aforementioned manufacturing method, forming a calcined powder includes forming the complex oxide powder including Zn and W as the calcined powder by heat-treating the primary mixture of the zinc oxide powder and the tungsten oxide powder at the temperature equal to or higher than 550° C. and lower than 1200° C. under the oxygen-containing atmosphere, and thus, the apparent density of the oxide sintered body is increased and the oxide sintered body that can be suitably used as the sputtering target is obtained. In addition, by sintering the molded body in an air atmosphere of atmospheric pressure, the electric resistivity of the oxide sintered body can be set to be equal to or lower than 1 Ωcm, and the oxide sintered body that can be suitably used as the sputtering target is obtained. The complex oxide may be short of oxygen or any metal may be substituted.

If the heat treatment temperature is lower than 550° C., the complex oxide powder including Zn and W is not obtained. If the heat treatment temperature is equal to or higher than 1200° C., the complex oxide powder including Zn and W decomposes and scatters, or a particle size of the complex oxide powder becomes too large and the complex oxide powder tends to become unsuitable for use.

In addition, since the complex oxide powder including Zn and W is formed as the calcined powder by the aforementioned heat treatment, the field-effect mobility and the reliability can be increased more effectively in the semiconductor device including, as a channel layer, the oxide semiconductor film formed by using the sputtering target including the obtained oxide sintered body.

It is preferable that the complex oxide including Zn and W includes a $ZnWO_4$ type crystal phase. This makes it possible to increase the apparent density of the oxide sintered body more effectively, and this is also advantageous in increasing the field-effect mobility and the reliability. The $ZnWO_4$ type crystal phase is a zinc tungstate compound crystal phase having a crystal structure expressed by a space group of P12/c1(13) and having a crystal structure defined in 01-088-0251 of the JCPDS card. As long as these crystal systems are exhibited, a lattice constant may vary due to shortage of oxygen or solid-dissolution of metal. The $ZnWO_4$ type crystal phase is identified by X-ray diffraction measurement.

Another method for manufacturing the oxide sintered body according to the present embodiment is a method for manufacturing the oxide sintered body according to the first embodiment, the method including: preparing a primary mixture of an indium oxide powder and a tungsten oxide powder; forming a calcined powder by heat-treating the primary mixture; preparing a secondary mixture of raw material powders, wherein the secondary mixture includes the calcined powder; forming a molded body by molding the secondary mixture; and forming the oxide sintered body by sintering the molded body. Forming a calcined powder includes forming a complex oxide powder including In and W as the calcined powder by heat-treating the primary mixture at a temperature equal to or higher than 700° C. and lower than 1200° C. under an oxygen-containing atmosphere.

According to the aforementioned manufacturing method, forming a calcined powder includes forming the complex oxide powder including In and W as the calcined powder by heat-treating the primary mixture of the indium oxide powder and the tungsten oxide powder at the temperature equal to or higher than 700° C. and lower than 1200° C. under the oxygen-containing atmosphere, and thus, the apparent density of the oxide sintered body is increased and the oxide sintered body that can be suitably used as the sputtering target is obtained. In addition, by sintering the molded body in an air atmosphere of atmospheric pressure, the electric resistivity of the oxide sintered body can be set to be equal to or lower than 1 Ωcm, and the oxide sintered body that can be suitably used as the sputtering target is obtained. The complex oxide may be short of oxygen or any metal may be substituted.

If the heat treatment temperature is lower than 700° C., the complex oxide powder including In and W is not obtained. If the heat treatment temperature is equal to or higher than 1200° C., the complex oxide powder including In and W decomposes and scatters, or a particle size of the complex oxide powder including In and W becomes too large and the complex oxide powder tends to become unsuitable for use.

In addition, since the complex oxide powder including In and W is formed as the calcined powder by the aforementioned heat treatment, the field-effect mobility and the reliability can be increased more effectively in the semiconductor device including, as a channel layer, the oxide semiconductor film formed by using the sputtering target including the obtained oxide sintered body.

It is preferable that the complex oxide including In and W includes an $In_6WO_{12}$ type crystal phase. This makes it possible to increase the apparent density of the oxide sintered body more effectively, and this is also advantageous in increasing the field-effect mobility and the reliability. In addition, by sintering the molded body in an air atmosphere of atmospheric pressure, the electric resistivity of the oxide sintered body can be set to be equal to or lower than 1 Ωcm, and the oxide sintered body that can be suitably used as the sputtering target is obtained. The $In_6WO_{12}$ crystal phase is an indium tungstate compound crystal phase having a trigonal crystal structure and having a crystal structure defined in 01-074-1410 of the JCPDS card. As long as these crystal systems are exhibited, a lattice constant may vary due to shortage of oxygen or solid-dissolution of metal. Since an indium tungstate compound crystal phase disclosed in Japanese Patent Laying-Open No. 2004-091265 is an $InW_3O_9$ phase, has a hexagonal crystal structure and has a crystal structure defined in 33-627 of the JCPDS card, the indium tungstate compound crystal phase has a crystal structure different from that of the $In_6WO_{12}$ phase. The $In_6WO_{12}$ type crystal phase is identified by X-ray diffraction measurement.

In either of the aforementioned manufacturing methods, it is preferable that the tungsten oxide powder includes at least one type of crystal phase selected from the group consisting of a $WO_3$ crystal phase, a $WO_2$ crystal phase and a $WO_{2.72}$ crystal phase. This makes it possible to increase the apparent density of the oxide sintered body more effectively, and this is also advantageous in increasing the field-effect mobility and the reliability. In addition, by sintering the molded body in an air atmosphere of atmospheric pressure, the electric resistivity of the oxide sintered body can be set to be equal to or lower than 1 Ωcm, and the oxide sintered body that can be suitably used as the sputtering target is obtained. From these perspectives, it is more preferable that the tungsten oxide powder is at least one type of powder selected from the group consisting of a $WO_3$ powder, a $WO_2$ powder and a $WO_{2.72}$ powder.

In addition, median particle size d50 of the tungsten oxide powder is preferably equal to or larger than 0.1 μm and equal to or smaller than 4 μm, more preferably equal to or larger than 0.2 μm and equal to or smaller than 2 μm, and further preferably equal to or larger than 0.3 μm and equal to or smaller than 1.5 μm. This makes it possible to increase the apparent density of the oxide sintered body more effectively. Median particle size d50 is obtained by BET specific surface area measurement. If median particle size d50 is smaller than 0.1 μm, handling of the powder is difficult and it tends to be difficult to uniformly mix the zinc oxide powder and the tungsten oxide powder or the indium oxide powder and the tungsten oxide powder.

If median particle size d50 is larger than 4 μm, the particle size of the complex oxide powder including Zn and W, which is obtained by mixing with the zinc oxide powder and thereafter heat-treating the mixture at the temperature equal to or higher than 550° C. and lower than 1200° C. under the oxygen-containing atmosphere, becomes large and it tends to be difficult to increase the apparent density of the oxide sintered body. Similarly, the particle size of the complex oxide powder including In and W, which is obtained by mixing with the indium oxide powder and thereafter heat-treating the mixture at the temperature equal to or higher than 700° C. and lower than 1200° C. under the oxygen-containing atmosphere, becomes large and it tends to be difficult to increase the apparent density of the oxide sintered body.

The method for manufacturing the oxide sintered body according to the present embodiment is not particularly limited. However, from the perspective of efficiently forming the oxide sintered body of the first embodiment, the method for manufacturing the oxide sintered body according to the present embodiment includes the following steps, for example.

(1) Step of Preparing Raw Material Powders

As the raw material powders for the oxide sintered body, oxide powders of the metal elements that constitute the oxide sintered body, such as an indium oxide powder (e.g., an $In_2O_3$ powder), a tungsten oxide powder (e.g., a $WO_3$ powder, a $WO_{2.72}$ powder, a $WO_2$ powder) and a zinc oxide powder (e.g., a ZnO powder), are prepared. As to the tungsten oxide powder, from the perspective of increasing the field-effect mobility and the reliability, it is preferable that not only the $WO_3$ powder but also the powder such as the $WO_{2.72}$ powder and the $WO_2$ powder having a chemical composition that is short of oxygen as compared with the $WO_3$ powder is used as a raw material. From this perspective, it is more preferable to use at least one of the $WO_{2.72}$ powder and the $WO_2$ powder as at least a part of the tungsten oxide powder. From the perspective of preventing unintended entry of the metal elements and Si into the oxide sintered body and obtaining the stable properties, it is preferable that a purity of the raw material powders is high, i.e., equal to or higher than 99.9 mass %.

As described above, from the perspective of increasing the apparent density of the oxide sintered body, it is preferable that median particle size d50 of the tungsten oxide powder is equal to or larger than 0.1 μm and equal to or smaller than 4 μm.

(2) Step of Preparing Primary Mixture (2-1) Step of Preparing Primary Mixture of Zinc Oxide Powder and Tungsten Oxide Powder Among the aforementioned raw material powders, the zinc oxide powder and the tungsten oxide powder are mixed (or pulverized and mixed). At this time, when it is desired to obtain the $ZnWO_4$ type phase as the crystal phase of the oxide sintered body, the tungsten oxide powder and the zinc oxide powder are mixed at a molar ratio of 1:1. When it is desired to obtain a $Zn_2W_3O_8$ type phase as the crystal phase of the oxide sintered body, the tungsten oxide powder and the zinc oxide powder are mixed at a molar ratio of 3:2. From the perspectives of increasing the apparent density of the oxide sintered body more effectively and of increasing the field-effect mobility and the reliability, it is preferable that the oxide sintered body includes the $ZnWO_4$ type phase. In addition, by sintering the molded body in an air atmosphere of atmospheric pressure, the electric resistivity of the oxide sintered body can be set to be equal to or lower than 1 Ωcm, and the oxide sintered body that can be suitably used as the sputtering target is obtained. A method for mixing the tungsten oxide powder and the zinc oxide powder is not particularly limited, and either a dry-type method or a wet-type method may be used. Specifically, the raw material powders are pulverized and mixed by using a ball mill, a planetary ball mill, a bead mill or the like. In this way, the primary mixture of the raw material powders is obtained. A drying method such as natural drying or a spray dryer can be used to dry the mixture obtained by using the wet-type pulverizing and mixing method.

(2-2) Step of Preparing Primary Mixture of Indium Oxide Powder and Tungsten Oxide Powder Among the aforementioned raw material powders, the indium oxide powder and the tungsten oxide powder are mixed (or pulverized and mixed). At this time, when it is desired to obtain the $In_6WO_{12}$ type crystal phase as the crystal phase of the oxide sintered body, the tungsten oxide powder and the indium oxide powder are mixed at a molar ratio of 1:3. A method for mixing the tungsten oxide powder and the indium oxide powder is not particularly limited, and either a dry-type method or a wet-type method may be used. Specifically, the raw material powders are pulverized and mixed by using a ball mill, a planetary ball mill, a bead mill or the like. In this way, the primary mixture of the raw material powders is obtained. A drying method such as natural drying or a spray dryer can be used to dry the mixture obtained by using the wet-type pulverizing and mixing method.

(3) Step of Forming Calcined Powder (3-1) Step of Forming Calcined Powder of Zinc Tungstate Oxide The obtained primary mixture is heat-treated (calcined) to form a calcined powder (a complex oxide powder including Zn and W). A temperature for calcining the primary mixture is preferably lower than 1200° C. to prevent a particle size of the calcined product from becoming too large and the apparent density of the sintered body from decreasing. In order to obtain the complex oxide powder including Zn and W as the calcined product and to obtain the $ZnWO_4$ type crystal phase, the temperature is preferably equal to or higher than 550° C. The temperature is more preferably equal to or higher than 550° C. and lower than 1000° C., and further preferably equal to or higher than 550° C. and equal to or lower than 900° C. From the perspective of making the particle size of the calcined powder as small as possible, a lower calcination temperature is more preferable, as long as the calcination temperature is a temperature at which the crystal phase is formed. In this way, the calcined powder including the $ZnWO_4$ type crystal phase is obtained. Any atmosphere may be used as a calcination atmosphere, as long as the calcination atmosphere is an oxygen-containing atmosphere. However, an air atmosphere of atmospheric pressure or an air atmosphere having a pressure higher than that of the air, or an oxygen-nitrogen mixing atmosphere including 25 volume % or more of oxygen of atmospheric pressure or having a pressure higher than that of the air is preferable. The atmospheric pressure or a pressure close thereto is more preferable because of high productivity.

(3-2) Step of Forming Calcined Powder of Indium Tungstate Oxide

The obtained primary mixture is heat-treated (calcined) to form a calcined powder (a complex oxide powder including In and W). A temperature for calcining the primary mixture is preferably lower than 1200° C. to prevent a particle size of the calcined product from becoming too large and the apparent density of the sintered body from decreasing. In order to obtain the complex oxide powder including In and W as the calcined product and to obtain the $In_6WO_{12}$ type crystal phase, the temperature is preferably equal to or higher than 700° C. The temperature is more preferably equal to or higher than 800° C. and lower than 1100° C. From the perspective of making the particle size of the calcined powder as small as possible, a lower calcination temperature is more preferable, as long as the calcination temperature is a temperature at which the crystal phase is formed. In this way, the calcined powder including the $In_6WO_{12}$ type crystal phase is obtained. Any atmosphere may be used as a calcination atmosphere, as long as the calcination atmosphere is an oxygen-containing atmosphere. However, an air atmosphere of atmospheric pressure or an air atmosphere having a pressure higher than that of the air, or an oxygen-nitrogen mixing atmosphere including 25 volume % or more of oxygen of atmospheric pressure or having a pressure higher than that of the air is preferable. The atmospheric pressure or a pressure close thereto is more preferable because of high productivity.

(4) Step of Preparing Secondary Mixture of Raw Material Powders Including Calcined Powder Next, the obtained calcined powder and the remaining powder [the indium oxide powder (e.g., the $In_2O_3$ powder) or the zinc oxide powder (e.g., the ZnO powder)] among the aforementioned raw material powders are mixed (or pulverized and mixed) similarly to preparation of the primary mixture. In this way, the secondary mixture of the raw material powders is obtained.

(5) Step of Forming Molded Body by Molding Secondary Mixture

Next, the obtained secondary mixture is molded. A method for molding the secondary mixture is not particularly limited. However, from the perspective of increasing the apparent density of the sintered body, a uniaxial press method, a CIP (cold isostatic press) method, a casting method or the like is preferable.

(6) Step of Forming Oxide Sintered Body by Sintering Molded Body

Next, the obtained molded body is sintered to form an oxide sintered body. It is preferable not to use a hot press sintering method at this time. A temperature for sintering the molded body is not particularly limited. However, in order to make the apparent density of the formed oxide sintered body higher than 6.6 g/cm³, the temperature is preferably equal to or higher than 900° C. and equal to or lower than 1200° C. In addition, a sintering atmosphere is not particularly limited. However, from the perspective of preventing the particle size of the crystals that constitute the oxide sintered body from becoming large and preventing occurrence of cracks, the atmospheric pressure or a pressure close thereto is preferable. In order to make the oxide sintered body suitable as the sputtering target, it is desired that the oxide sintered body has an electric resistivity of equal to or lower than 1 Ωcm. In order to increase the apparent density, raising the sintering temperature is conceivable. However, if the sintering temperature is equal to or higher than 1200° C., there is a problem that the tungsten oxide sublimates and disappears from the oxide sintered body. Conventionally, in order to increase the apparent density, the oxygen gas has been generally passed during sintering to increase an oxygen partial pressure during sintering. In addition, in order to achieve the electric resistivity of the sintered body of equal to or lower than 1 Ωcm, heat treatment has been generally performed in a vacuum atmosphere or a reducing atmosphere such as a nitrogen atmosphere after sintering. In the present invention, simply by performing sintering in the air atmosphere of atmospheric pressure, the oxide sintered body having a high apparent density and an electric resistivity of equal to or lower than 1 Ωcm can be achieved without performing heat treatment in the reducing atmosphere.

[Third Embodiment: Sputtering Target]

The sputtering target according to the present embodiment includes the oxide sintered body of the first embodiment. Therefore, the sputtering target according to the present embodiment can be suitably used to form the oxide semiconductor film of the semiconductor device having high field-effect mobility and reliability by the sputtering method.

The sputtering target according to the present embodiment preferably includes the oxide sintered body of the first embodiment, and is more preferably formed of the oxide sintered body of the first embodiment, in order to allow the sputtering target according to the present embodiment to be suitably used to form the oxide semiconductor film of the semiconductor device having high field-effect mobility and reliability by the sputtering method.

[Fourth Embodiment: Semiconductor Device]

Referring to FIG. 1, a semiconductor device 10 according to the present embodiment includes an oxide semiconductor film 14 formed by the sputtering method by using the oxide sintered body of the first embodiment as the sputtering target. Since semiconductor device 10 according to the present embodiment includes oxide semiconductor film 14, semiconductor device 10 according to the present embodiment can have characteristics of high field-effect mobility and high reliability.

Although semiconductor device 10 according to the present embodiment is not particularly limited, semiconductor device 10 according to the present embodiment is, for example, a semiconductor device including, as a channel layer, oxide semiconductor film 14 formed by the sputtering method by using the oxide sintered body of the first embodiment as the sputtering target, and this semiconductor device can be, for example, a TFT (thin-film transistor). Since the TFT which is one example of semiconductor device 10 according to the present embodiment includes, as a channel layer, oxide semiconductor film 14 formed by the sputtering method by using the oxide sintered body of the first embodiment as the target, the field-effect mobility can be increased and the reliability can also be increased.

In semiconductor device 10 according to the present embodiment, a content rate of W to a total of In, W and Zn in oxide semiconductor film 14 (W content rate in the oxide semiconductor film) is preferably higher than 0.5 atomic % and equal to or lower than 5.0 atomic %, a content rate of Zn to the total of In, W and Zn in oxide semiconductor film 14 (Zn content rate in the oxide semiconductor film) is preferably equal to or higher than 1.2 atomic % and equal to or lower than 19 atomic %, and an atomic ratio of Zn to W in oxide semiconductor film 14 (Zn/W ratio in the oxide semiconductor film) is preferably higher than 1.0 and lower than 60. As a result, the field-effect mobility and the reliability can be increased.

From the perspective of increasing the field-effect mobility and the reliability, the W content rate in oxide semiconductor film 14 is more preferably equal to or higher than 0.6 atomic %, and more preferably equal to or lower than 3 atomic %, and further preferably equal to or lower than 2 atomic %. If the W content rate in oxide semiconductor film 14 is equal to or lower than 0.5 atomic %, the field-effect mobility decreases and the reliability also decreases by the heat treatment in semiconductor device 10 including oxide semiconductor film 14 as the channel layer. If the W content rate in oxide semiconductor film 14 exceeds 5 atomic %, the field-effect mobility decreases in semiconductor device 10 including oxide semiconductor film 14 as the channel layer.

If the Zn content rate in oxide semiconductor film 14 is equal to or higher than 1.2 atomic % and equal to or lower than 19 atomic %, and the Zn/W ratio in oxide semiconductor film 14 is higher than 1.0 and lower than 60, the field-effect mobility can be increased and the reliability can also be increased in semiconductor device 10 including oxide semiconductor film 14 as the channel layer.

From the perspective of increasing the field-effect mobility and the reliability, the Zn content rate in oxide semiconductor film 14 is more preferably equal to or higher than 3 atomic %, and further preferably equal to or higher than 10 atomic %, and more preferably equal to or lower than 18 atomic %. From the perspective of increasing the field-effect mobility, it is desirable that the In/(In+Zn) atomic ratio is higher than 0.8.

If the Zn content rate in oxide semiconductor film 14 is lower than 1.2 atomic %, the reliability decreases in semiconductor device 10 including oxide semiconductor film 14 as the channel layer. If the Zn content rate in oxide semiconductor film 14 exceeds 19 atomic %, the field-effect mobility decreases in semiconductor device 10 including oxide semiconductor film 14 as the channel layer.

If the Zn/W ratio in oxide semiconductor film 14 is equal to or lower than 1.0, the reliability decreases in semiconductor device 10 including oxide semiconductor film 14 as the channel layer. The Zn/W ratio is more preferably equal to or higher than 3.0, and further preferably equal to or higher than 5.0. If the Zn/W ratio in oxide semiconductor film 14 is equal to or higher than 60, the field-effect mobility decreases in semiconductor device 10 including oxide semiconductor film 14 as the channel layer. The Zn/W ratio is more preferably equal to or lower than 20, and further preferably equal to or lower than 15.

The chemical composition, i.e., the content rate of each element in oxide semiconductor film 14 is measured by RBS (Rutherford backscattering analysis). Based on this measurement result, the W content rate, the Zn content rate and the Zn/W ratio are calculated. When analysis by the RBS cannot be performed, the chemical composition is measured by the TEM-EDX (a transmission electron microscope with an energy-dispersive X-ray fluorescence spectrometer). From the perspective of the accuracy of chemical composition measurement, measurement by the RBS is desirable. When the TEM-EDX is used, at least three or more oxide semiconductor films are first prepared as samples for making a calibration curve, and each of these oxide semiconductor films are made of In, W, Zn, and O, has a composition close to that of an oxide semiconductor film to be measured, and can be subjected to analysis by the RBS. Next, as to these samples, contained amounts of In, W and Zn are measured by the RBS and the contained amounts of In, W and Zn are measured by the TEM-EDX. Based on these measurement values, a calibration curve indicating a relationship between the measurement value of the contained amounts of In, W and Zn by the TEM-EDX and the measurement value of the contained amounts of In, W and Zn by the RBS is made. Then, as to the oxide semiconductor film to be measured, contained amounts of In, W and Zn are measured by the TEM-EDX, and thereafter, this measurement value is converted into a measurement value of the contained amounts of In, W and Zn by the RBS based on the aforementioned calibration curve. This converted value refers to the contained amounts of In, W and Zn in the oxide semiconductor film to be measured.

The electric resistivity of oxide semiconductor film 14 is preferably equal to or higher than $10^{-1}$ Ωcm. An oxide including indium is known as a transparent electroconductive film, and as described in Japanese Patent Laying-Open No. 2002-256424, an electric resistivity of a film used as the transparent electroconductive film is generally lower than $10^{-1}$ Ωcm. On the other hand, when oxide semiconductor film 14 is used as a channel layer of a semiconductor device as in the present invention, it is desirable that the electric resistivity of oxide semiconductor film 14 is equal to or higher than $10^{-1}$ Ωcm. In order to achieve this electric resistivity value, it is preferable to comprehensively consider the film thickness described above, the W content rate, the Zn content rate, and the Zn/W ratio. In addition, it is desirable to perform, in the oxygen-containing atmosphere, the heating treatment after formation of oxide semiconductor film 14 by the sputtering method, and/or to perform the heating treatment while using an oxide for a layer (an etching stopper layer, a gate insulating layer, a passivation layer) that is in contact with at least a part of oxide semiconductor film 14.

Oxide semiconductor film 14 is preferably composed of nanocrystalline oxide or amorphous oxide, because the field-effect mobility can be increased and the reliability can also be increased in semiconductor device 10 (e.g., a TFT) including oxide semiconductor film 14 as a channel layer.

In the present specification, "nanocrystalline oxide" refers to an oxide in which a peak caused by the crystals is not observed and only a broad peak called "halo" appearing on the low angle side is observed by X-ray diffraction measurement in accordance with the following conditions, and in which a ring-like pattern is observed when transmission electron beam diffraction measurement of a minute region is performed by using a transmission electron microscope in accordance with the following conditions. The ring-like pattern includes the case in which spots gather to form the ring-like pattern.

In the present specification, "amorphous oxide" refers to an oxide in which a peak caused by the crystals is not observed and only a broad peak called "halo" appearing on the low angle side is observed by X-ray diffraction measurement in accordance with the following conditions, and in which an obscure pattern called "halo" is again observed when transmission electron beam diffraction measurement of a minute region is performed by using a transmission electron microscope in accordance with the following conditions.

(X-Ray Diffraction Measurement Conditions)
Measurement method: In-plane method (slit collimation method)
X-ray generating portion: anticathode Cu, output of 50 kV, 300 mA
Detecting portion: scintillation counter
Incidence portion: slit collimation Solar slit: incidence side longitudinal divergence angle of 0.48°
light receiving side longitudinal divergence angle of 0.41°
Slit: incidence side S1=1 mm*10 mm
light receiving side S2=0.2 mm*10 mm
Scanning condition: scanning axis of 2θχ/φ
Scanning mode: step measurement, scanning range of 10 to 80°, step width of 0.1°, step time of 8 sec.

(Transmission Electron Beam Diffraction Measurement Conditions)
Measurement method: microscopic electron beam diffraction method
Accelerating voltage: 200 kV
Beam diameter: same as or equivalent to a film thickness of an oxide semiconductor film to be measured In the case where oxide semiconductor film 14 is composed of nanocrystalline oxide, the ring-like pattern is observed as described above and a spot-like pattern is not observed when transmission electron beam diffraction measurement of a minute region is performed in accordance with the aforementioned conditions. In contrast, an oxide semiconductor film disclosed in Japanese Patent No. 5172918, for example, includes c-axis oriented crystals along the direction perpendicular to the surface of the film, and when the nanocrystals in a minute region are oriented in a certain direction as described above, the spot-like pattern is observed. In the case where oxide semiconductor film 14 is composed of nanocrystalline oxide, the nanocrystals have a non-orientation property, i.e., the nanocrystals are not oriented with respect to the surface of the film, and have random orientation, when a surface (film cross section) perpendicular to the film surface is at least observed. In other words, the crystal axis is not oriented with respect to the film thickness direction.

Since oxide semiconductor film 14 is composed of nanocrystalline oxide or amorphous oxide, a high field-effect mobility can be achieved in semiconductor device 10 including oxide semiconductor film 14 as a channel layer. In order to increase the mobility, oxide semiconductor film 14 is more desirably composed of amorphous oxide. When the aforementioned Zn content rate is equal to or higher than 10 atomic % and/or the aforementioned W content rate is equal to or higher than 0.4 atomic %, oxide semiconductor film 14 is likely to be composed of amorphous oxide and the amorphous oxide is stable until a higher heating treatment temperature is reached.

It is preferable that a film thickness of oxide semiconductor film 14 is equal to or greater than 2 nm and equal to or smaller than 25 nm. When the film thickness is equal to or greater than 2 nm and equal to or smaller than 25 nm, a higher field-effect mobility can be achieved and the reliability can also be increased in semiconductor device 10 including oxide semiconductor film 14 as a channel layer. If the film thickness exceeds 25 nm, oxide semiconductor film 14 tends not to be composed of nanocrystalline oxide or amorphous oxide, and an increase in field-effect mobility tends to be impossible. By increasing the aforementioned Zn content rate and/or increasing the aforementioned W content rate, the nanocrystalline oxide or amorphous oxide can be maintained until a greater film thickness is reached.

When the film thickness of oxide semiconductor film 14 is equal to or greater than 2 nm and equal to or smaller than 25 nm, oxide semiconductor film 14 can be composed of nanocrystalline oxide or amorphous oxide. As a result, a high field-effect mobility can be achieved in semiconductor device 10 including oxide semiconductor film 14 as a channel layer. From the perspective of achieving a higher field-effect mobility, the film thickness of oxide semiconductor film 14 is more preferably equal to or greater than 5 nm, and more preferably equal to or smaller than 18 nm.

The film thickness of oxide semiconductor film 14 is calculated by observing a film cross section with a transmission electron microscope, measuring a distance from a lowermost surface to an uppermost surface of the film, and dividing the distance by an observation magnification. Measurement of the distance is performed at five points and the film thickness is calculated from an average value thereof.

Oxide semiconductor film 14 can be obtained by a manufacturing method including a step of film formation by the sputtering method. This is advantageous in increasing the field-effect mobility and the reliability in semiconductor device 10 (e.g., a TFT) including oxide semiconductor film 14 as a channel layer.

The sputtering method refers to a method for forming the film constituted by the atoms forming the target, by arranging the target and the substrate in a film formation chamber to face each other, applying a voltage to the target, and sputtering a surface of the target with a noble gas ion, thereby releasing the atoms forming the target from the target and depositing the atoms on the substrate.

In addition to the sputtering method, a pulsed laser deposition (PLD) method, a heating deposition method and the like are proposed as a method for forming the oxide semiconductor film. For the aforementioned reasons, however, the use of the sputtering method is preferable.

A magnetron sputtering method, a facing target-type magnetron sputtering method and the like can be used as the sputtering method. As the atmospheric gas during sputtering, an Ar gas, a Kr gas and a Xe gas can be used, and a mixture of these gases with an oxygen gas can also be used.

In addition, oxide semiconductor film 14 can also be obtained by performing the heating treatment after film formation by the sputtering method, or by performing the heating treatment during film formation by the sputtering method. As a result, oxide semiconductor film 14 composed of nanocrystalline oxide or amorphous oxide is easily obtained. In addition, oxide semiconductor film 14 obtained by this method is advantageous in increasing the field-effect mobility and the reliability in semiconductor device 10 (e.g., a TFT) including oxide semiconductor film 14 as a channel layer.

The heating treatment performed during film formation by the sputtering method can be performed by heating a substrate during this film formation. The substrate temperature is preferably equal to or higher than 100° C. and equal to or lower than 250° C. The heating treatment time corresponds to the film formation time and the film formation time depends on the film thickness of oxide semiconductor film 14 to be formed. The film formation time can be, for example, approximately 10 seconds to 10 minutes.

The heating treatment performed after film formation by the sputtering method can also be performed by heating a substrate. The substrate temperature is preferably equal to or higher than 100° C. and equal to or lower than 350° C. The atmosphere of the heating treatment may be various types of atmospheres such as in the air, in the nitrogen gas, in the nitrogen gas-oxygen gas, in the Ar gas, in the Ar-oxygen gas, in the water vapor-containing air, and in the water vapor-containing nitrogen. The pressure in the atmosphere can be a pressure under reduced pressure conditions (e.g., lower than 0.1 Pa) or a pressure under increased pressure conditions (e.g., 0.1 Pa to 9 MPa), in addition to the atmospheric pressure, and is preferably approximately the atmospheric pressure. The heating treatment time can be, for example, approximately 3 minutes to 2 hours, and is preferably approximately 10 minutes to 90 minutes. In semiconductor device 10 according to the present embodiment, it is desirable to perform the heating treatment in the oxygen-containing atmosphere when an oxide layer (an etching stopper layer, a gate insulating film, a passivation film) is not in contact with at least a part of oxide semiconductor film 14.

Figure 2:
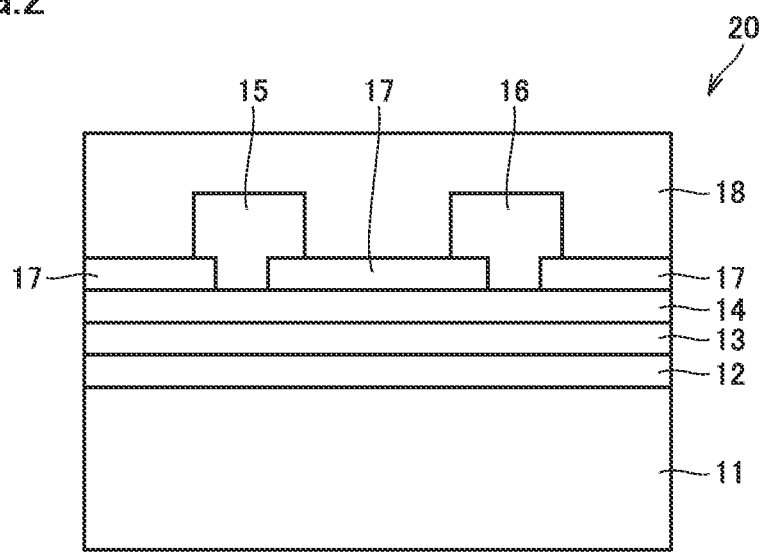
FIG. 2 is a schematic cross-sectional view showing another example of the semiconductor device according to one aspect of the present invention.
Figure 3:
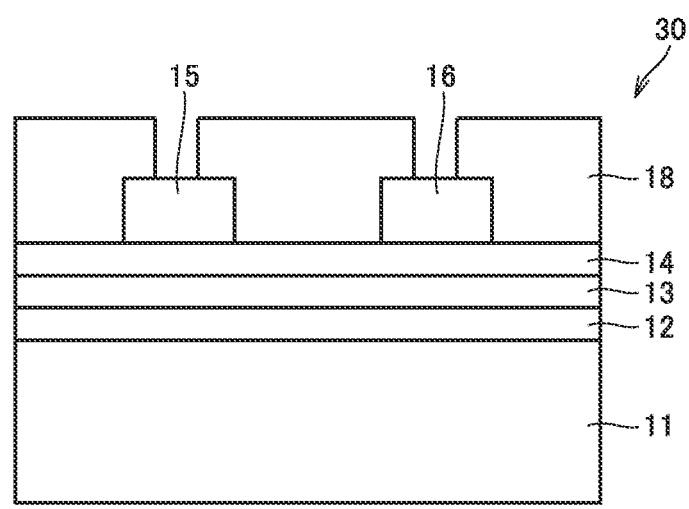
FIG. 3 is a schematic cross-sectional view showing still another example of the semiconductor device according to one aspect of the present invention.

FIGS. 1 to 3 are schematic views showing several examples of the semiconductor device (TFT) according to the present embodiment. Semiconductor device 10 shown in FIG. 1 includes a substrate 11, a gate electrode 12 arranged on substrate 11, a gate insulating film 13 arranged on gate electrode 12 as an insulating layer, an oxide semiconductor film 14 arranged on gate insulating film 13 as a channel layer, and a source electrode 15 and a drain electrode 16 arranged on oxide semiconductor film 14 so as not to be in contact with each other.

A semiconductor device 20 shown in FIG. 2 has a configuration similar to that of semiconductor device 10 shown in FIG. 1, except that semiconductor device 20 further includes an etching stopper layer 17 arranged on oxide semiconductor film 14 and having a contact hole, and a passivation film 18 arranged on etching stopper layer 17, source electrode 15 and drain electrode 16. In semiconductor device 20 shown in FIG. 2, passivation film 18 can be omitted as in semiconductor device 10 shown in FIG. 1. A semiconductor device 30 shown in FIG. 3 has a configuration similar to that of semiconductor device 10 shown in FIG. 1, except that semiconductor device 30 further includes passivation film 18 arranged on oxide semiconductor film 14, source electrode 15 and drain electrode 16.

It is preferable that the semiconductor device according to the present embodiment includes oxide semiconductor film 14 described above and further includes a layer (hereinafter, this layer will be also referred to as "adjacent layer") which is arranged to be in contact with at least a part of this oxide semiconductor film 14 and which is at least one of a nanocrystalline layer and an amorphous layer. By providing the adjacent layer, oxide semiconductor film 14 formed to be in contact with the adjacent layer is affected by the crystallinity of the adjacent layer and easily becomes a film composed of nanocrystalline oxide or amorphous oxide. With this, an excellent field-effect mobility can also be provided to the semiconductor device. According to the semiconductor device including the adjacent layer, a high field-effect mobility can be maintained even when the aforementioned heating treatment temperature is high. In the case where the film composed of amorphous oxide can be maintained even when the heating treatment temperature is higher, a high field-effect mobility can be kept and high reliability can be achieved.

The whole of the aforementioned adjacent layer may be at least either nanocrystalline or amorphous, or a portion of the aforementioned adjacent layer that is in contact with oxide semiconductor film 14 may be at least either nanocrystalline or amorphous. In the latter case, the portion that is at least either nanocrystalline or amorphous may be the whole over the film surface direction in the adjacent layer, or may be a part of the surface that is in contact with oxide semiconductor film 14.

The adjacent layer that is at least one of a nanocrystalline layer and an amorphous layer may be a layer formed to be in contact with oxide semiconductor film 14 as an underlayer (lower layer) of oxide semiconductor film 14, or may be an upper layer formed to be in contact with an upper part of oxide semiconductor film 14. In addition, the semiconductor device according to the present embodiment can include two or more adjacent layers, and in this case, these adjacent layers can be a lower layer and an upper layer of oxide semiconductor film 14.

For example, in semiconductor device 10 shown in FIG. 1, gate insulating film 13 may be the aforementioned adjacent layer. In semiconductor device 20 shown in FIG. 2, gate insulating film 13 and/or etching stopper layer 17 may be the aforementioned adjacent layer. In semiconductor device 30 shown in FIG. 3, gate insulating film 13 and/or passivation film 18 may be the aforementioned adjacent layer.

It is preferable that the aforementioned adjacent layer is an oxide layer including at least one of silicon (Si) and aluminum (Al). The feature that the adjacent layer is an oxide layer including at least one of Si and Al is advantageous in increasing the field-effect mobility and the reliability of the semiconductor device, and especially, this feature is advantageous in providing the semiconductor device that can maintain a high field-effect mobility even when the aforementioned heating treatment temperature is high. In addition, the feature that the adjacent layer is an oxide layer including at least one of Si and Al is advantageous in decreasing the OFF current, and is also advantageous in setting the electric resistivity of oxide semiconductor film 14 to be equal to or higher than $10^{-1}$ Ωcm. Although the oxide including at least one of Si and Al is not particularly limited, examples of the oxide can include silicon oxide ($SiO_x$), aluminum oxide ($Al_mO_n$) and the like.

Figure 4:
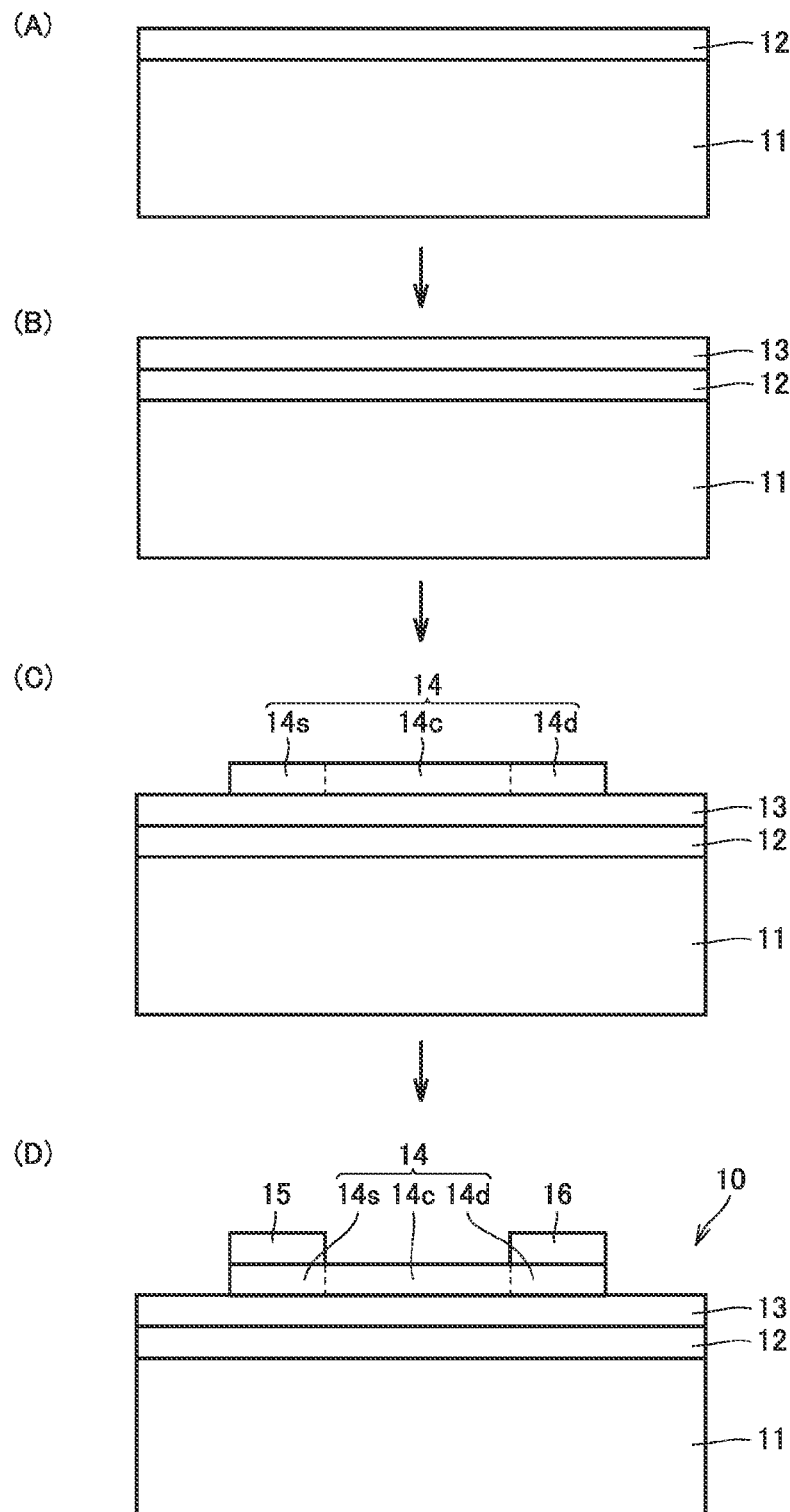
FIG. 4 is a schematic cross-sectional view showing one example of a method for manufacturing the semiconductor device shown in FIG. 1.

Next, a method for manufacturing the semiconductor device according to the present embodiment will be described. The method for manufacturing the semiconductor device includes the steps of preparing the sputtering target of the aforementioned embodiment, and forming the aforementioned oxide semiconductor film by the sputtering method with the sputtering target. First, a method for manufacturing semiconductor device 10 shown in FIG. 1 will be described. This manufacturing method is not particularly limited. However, from the perspective of efficiently manufacturing semiconductor device 10 having high characteristics, it is preferable that, referring to FIG. 4, the method for manufacturing semiconductor device 10 shown in FIG. 1 includes the steps of forming gate electrode 12 on substrate 11 (FIG. 4(A)), forming gate insulating film 13 on gate electrode 12 as the insulating layer (FIG. 4(B)), forming oxide semiconductor film 14 on gate insulating film 13 as the channel layer (FIG. 4(C)), and forming source electrode 15 and drain electrode 16 on oxide semiconductor film 14 so as not to be in contact with each other (FIG. 4(D)).

(1) Step of Forming Gate Electrode

Referring to FIG. 4(A), gate electrode 12 is formed on substrate 11. Although substrate 11 is not particularly limited, a quartz glass substrate, an alkali-free glass substrate, an alkali glass substrate or the like is preferable from the perspective of increasing the transparency, the price stability and the surface smoothness. Although gate electrode 12 is not particularly limited, an Mo electrode, a Ti electrode, a W electrode, an Al electrode, a Cu electrode or the like is preferable from the perspective of high oxidation resistance and low electric resistance. Although a method for forming gate electrode 12 is not particularly limited, the vacuum vapor deposition method, the sputtering method or the like is preferable from the perspective of allowing large-area and uniform formation on a main surface of substrate 11.

(2) Step of Forming Gate Insulating Film

Referring to FIG. 4(B), gate insulating film 13 is formed on gate electrode 12 as the insulating layer. Although a method for forming gate insulating film 13 is not particularly limited, a plasma CVD (chemical vapor deposition) method or the like is preferable from the perspectives of allowing large-area and uniform formation and of ensuring the insulation property.

Although a material of gate insulating film 13 is not particularly limited, silicon oxide ($SiO_x$), silicon nitride ($SiN_y$) or the like is preferable from the perspective of the insulation property. When gate insulating film 13 is the aforementioned adjacent layer, an oxide including at least one of Si and Al, such as silicon oxide ($SiO_x$) and aluminum oxide ($Al_mO_n$), is preferable.

(3) Step of Forming Oxide Semiconductor Film

Referring to FIG. 4(C), oxide semiconductor film 14 is formed on gate insulating film 13 as the channel layer. As described above, it is preferable that oxide semiconductor film 14 is formed by a process including the step of film formation by the sputtering method, and it is preferable, for example, that oxide semiconductor film 14 is formed by performing the heating treatment after film formation by the sputtering method, or by performing the heating treatment during film formation by the sputtering method. The oxide sintered body of the first embodiment described above is used as a raw material target for the sputtering method.

(4) Step of Forming Source Electrode and Drain Electrode

Referring to FIG. 4(D), source electrode 15 and drain electrode 16 are formed on oxide semiconductor film 14 so as not to be in contact with each other. Although source electrode 15 and drain electrode 16 are not particularly limited, an Mo electrode, a Ti electrode, a W electrode, an Al electrode, a Cu electrode or the like is preferable from the perspective of high oxidation resistance, low electric resistance and low contact electric resistance with oxide semiconductor film 14. Although a method for forming source electrode 15 and drain electrode 16 is not particularly limited, the vacuum vapor deposition method, the sputtering method or the like is preferable from the perspective of allowing large-area and uniform formation on the main surface of substrate 11 having oxide semiconductor film 14 formed thereon. Although a method for forming source electrode 15 and drain electrode 16 so as not to be in contact with each other is not particularly limited, formation by an etching method using a photoresist is preferable from the perspective of allowing large-area and uniform formation of the patterns of source electrode 15 and drain electrode 16.

Figure 5:
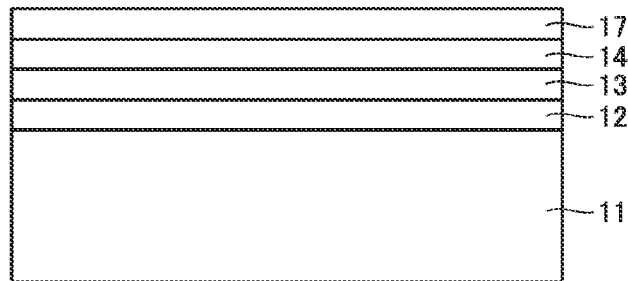
FIG. 5 is a schematic cross-sectional view showing one example of a method for manufacturing the semiconductor device shown in FIG. 2.
Figure 5:
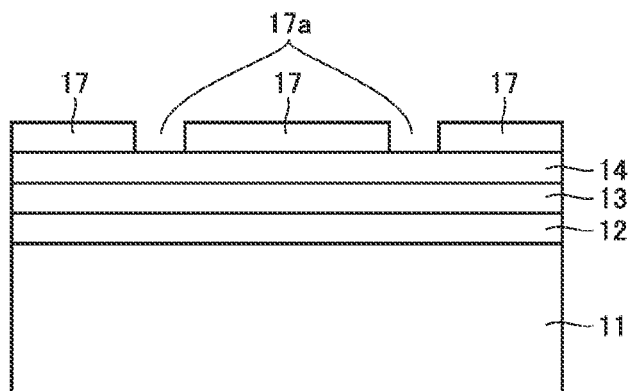
Figure 5:
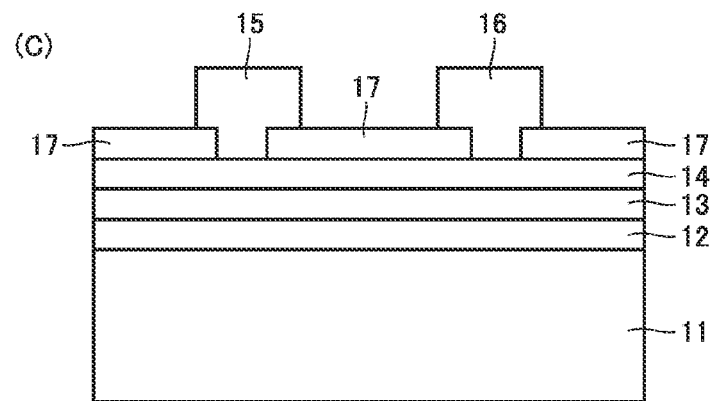
Figure 5:
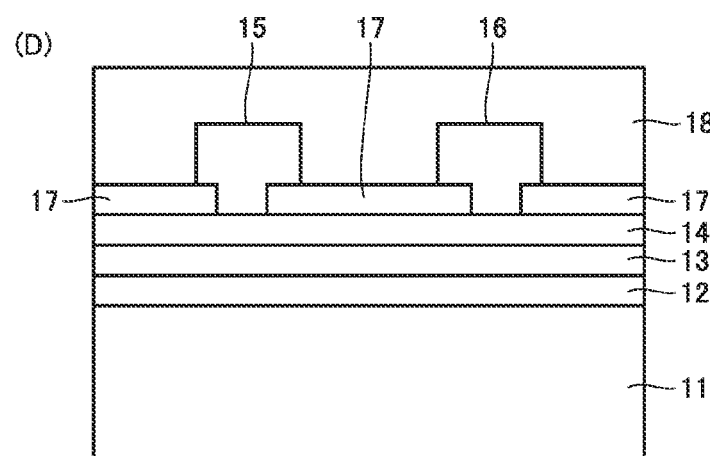

Next, a method for manufacturing semiconductor device 20 shown in FIG. 2 will be described. This manufacturing method can be similar to the method for manufacturing semiconductor device 10 shown in FIG. 1, except that this manufacturing method further includes the steps of forming etching stopper layer 17 having a contact hole 17a, and forming passivation film 18. Specifically, it is preferable that, referring to FIGS. 4 and 5, the method for manufacturing semiconductor device 20 shown in FIG. 2 includes the steps of forming gate electrode 12 on substrate 11 (FIG. 4(A)), forming gate insulating film 13 on gate electrode 12 as the insulating layer (FIG. 4(B)), forming oxide semiconductor film 14 on gate insulating film 13 as the channel layer (FIG. 4(C)), forming etching stopper layer 17 on oxide semiconductor film 14 (FIG. 5(A)), forming contact hole 17a in etching stopper layer 17 (FIG. 5(B)), forming source electrode 15 and drain electrode 16 on oxide semiconductor film 14 and etching stopper layer 17 so as not to be in contact with each other (FIG. 5(C)), and forming passivation film 18 on etching stopper layer 17, source electrode 15 and drain electrode 16 (FIG. 5(D)).

Although a material of etching stopper layer 17 is not particularly limited, silicon oxide ($SiO_x$), silicon nitride ($SiN_y$), aluminum oxide ($Al_mO_n$) or the like is preferable from the perspective of the insulation property. When etching stopper layer 17 is the aforementioned adjacent layer, an oxide including at least one of Si and Al, such as silicon oxide ($SiO_x$) and aluminum oxide ($Al_mO_n$), is preferable. Etching stopper layer 17 may be a combination of films made of different materials. Although a method for forming etching stopper layer 17 is not particularly limited, the plasma CVD (chemical vapor deposition) method, the sputtering method, the vacuum vapor deposition method or the like is preferable from the perspectives of allowing large-area and uniform formation and of ensuring the insulation property.

Since source electrode 15 and drain electrode 16 need to be in contact with oxide semiconductor film 14, etching stopper layer 17 is formed on oxide semiconductor film 14, and thereafter, contact hole 17a is formed in etching stopper layer 17 (FIG. 5(B)). An example of a method for forming contact hole 17a can include dry etching or wet etching. By etching stopper layer 17 and forming contact hole 17a by this method, a surface of oxide semiconductor film 14 is exposed in the etched portion.

Similarly to the method for manufacturing semiconductor device 10 shown in FIG. 1, in the method for manufacturing semiconductor device 20 shown in FIG. 2, source electrode 15 and drain electrode 16 are formed on oxide semiconductor film 14 and etching stopper layer 17 so as not to be in contact with each other (FIG. 5(C)), and thereafter, passivation film 18 is formed on etching stopper layer 17, source electrode 15 and drain electrode 16 (FIG. 5(D)).

Although a material of passivation film 18 is not particularly limited, silicon oxide ($SiO_x$), silicon nitride ($SiN_y$), aluminum oxide ($Al_mO_n$) or the like is preferable from the perspective of the insulation property. When passivation film 18 is the aforementioned adjacent layer, an oxide including at least one of Si and Al, such as silicon oxide ($SiO_x$) and aluminum oxide ($Al_mO_n$), is preferable. Passivation film 18 may be a combination of films made of different materials. Although a method for forming passivation film 18 is not particularly limited, the plasma CVD (chemical vapor deposition) method, the sputtering method, the vacuum vapor deposition method or the like is preferable from the perspectives of allowing large-area and uniform formation and of ensuring the insulation property.

Like semiconductor device 30 shown in FIG. 3, a back channel etching (BCE) structure may be employed without forming etching stopper layer 17, and passivation film 18 may be directly formed on oxide semiconductor film 14, source electrode 15 and drain electrode 16. As to passivation film 18 in this case, the above description about passivation film 18 of semiconductor device 20 shown in FIG. 2 is cited.

EXAMPLE

Examples 1 to 11 and Comparative Examples 1 to 10

(1) Fabrication of Oxide Sintered Body
(1-1) Preparation of Powder Raw Materials A tungsten oxide powder (denoted as "W" in Table 1) having a composition and median particle size d50 (denoted as "W particle size" in Table 1) shown in Table 1 and having a purity of 99.99 mass %, a ZnO powder (denoted as "Z" in Table 1) having median particle size d50 of 1.0 μm and having a purity of 99.99 mass %, and an $In_2O_3$ powder (denoted as "I" in Table 1) having median particle size d50 of 1.0 μm and having a purity of 99.99 mass % were prepared.

(1-2) Preparation of Primary Mixture of Raw Material Powders

First, among the prepared raw material powders, the tungsten oxide powder and the ZnO powder, or the tungsten oxide powder and the indium oxide powder were put into a ball mill, and were pulverized and mixed for 18 hours to prepare a primary mixture of the raw material powders. A molar mixing ratio between the tungsten oxide powder and the ZnO powder was set at approximately tungsten oxide powder:ZnO powder=1:1. A molar mixing ratio between the tungsten oxide powder and the indium oxide powder was set at approximately tungsten oxide powder:$In_2O_3$ powder=1:3. Ethanol was used as a dispersion medium at the time of pulverization and mixing. The obtained primary mixture of the raw material powders was dried in the atmosphere.

(1-3) Formation of Calcined Powder by Heat-Treating Primary Mixture

Next, the obtained primary mixture of the raw material powders was put into a crucible made of alumina, and was calcined for 8 hours in an air atmosphere at a calcination temperature shown in Table 1, to obtain a calcined powder composed of the $ZnWO_4$ type crystal phase or a calcined powder composed of the $In_6WO_{12}$ type crystal phase. Table 1 shows the composition of the crystal phases constituting the obtained calcined powder.

(1-4) Preparation of Secondary Mixture of Raw Material Powders Including Calcined Powder Next, the obtained calcined powder was put into a pot together with the $In_2O_3$ powder or the ZnO powder which was the prepared remaining raw material powder, and further was put into a pulverizing and mixing ball mill, and was pulverized and mixed for 12 hours to prepare a secondary mixture of the raw material powders. A mixing ratio of these powders was set such that a molar ratio among W, Zn and In in the mixture was as shown in Table 1. Ethanol was used as a dispersion medium at the time of pulverization and mixing. The obtained mixed powder was dried by spray drying.

(1-5) Formation of Molded Body by Molding Secondary Mixture

Next, the obtained secondary mixture was molded by pressing, and further was pressure-molded at a pressure of 190 MPa in the static water having a room temperature (5° C. to 30° C.) by CIP. A disk-shaped molded body having a diameter of 100 mm and a thickness of about 9 mm was thus obtained.

(1-6) Formation of Oxide Sintered Body by Sintering Molded Body

Next, the obtained molded body was sintered for 8 hours under the atmospheric pressure in an air atmosphere at the sintering temperatures shown in Table 1. An oxide sintered body including a bixbite type crystal phase ($In_2O_3$ type phase) having tungsten (in some cases, zinc as well) solid-dissolved therein was thus obtained.

(1-7) Evaluation of Properties of Oxide Sintered Body

The crystal phases of the obtained oxide sintered body were identified by obtaining a sample from a part of the oxide sintered body and conducting crystal analysis by a powder X-ray diffraction method. The X-ray diffraction measurement conditions were as follows. The crystal phases present in the oxide sintered body were shown in Table 1.

(X-ray Diffraction Measurement Conditions)
θ-2θ method
X-ray source: Cu Kα ray
X-ray tube voltage: 45 kV
X-ray tube current: 40 mA
Step width: 0.03 deg Step time: 1 sec/step
Measurement range 2θ: 10 deg to 90 deg It was confirmed as follows that the $In_2O_3$ type phase which is the bixbite type crystal phase was a main component in the obtained oxide sintered body. First, the presence of the bixbite type crystal phase, the hexagonal wurtz structure type crystal and the zinc tungstate type crystal phase, and the presence of the crystal phases other than these crystal phases were identified by the X-ray diffraction.

The presence of the bixbite type crystal phase, the hexagonal wurtz type crystal phase and the zinc tungstate compound crystal phase, the presence of the crystal phases other than these crystal phases, and a ratio of the respective crystal phases were identified as follows by X-ray diffraction. A sample was obtained from a part of the oxide sintered body and a surface of the sample was polished to make the surface smooth. Then, by using the SEM-EDX (scanning secondary electron microscope with an energy-dispersive X-ray fluorescence spectrometer), the surface of the sample was observed by the SEM (scanning secondary electron microscope) and a composition ratio of the metal elements of the respective crystal particles was analyzed by the EDX (energy-dispersive X-ray fluorescence spectrometer). Then, the crystal particles were grouped based on a tendency of the composition ratio of the metal elements of these crystal particles. Specifically, the crystal particles were divided into a group A of the crystal particles having a high Zn content rate and having a very low W content rate or not including W, a group B of the crystal particles having a high Zn content rate and a high W content rate, and a group C of the crystal particles having a very low Zn content rate and a very low W content rate and having a high In content rate. The group A was concluded as the hexagonal wurtz type crystal phase, the group B was concluded as the zinc tungstate compound crystal phase, the group C was concluded as the bixbite type $In_2O_3$ phase, and the other group was concluded as the other crystal phases.

The occupancy rate of the bixbite type crystal phase in the oxide sintered body (a rate of the bixbite type crystal phase in the oxide sintered body) is defined as a ratio (percentage) of an area of the bixbite type crystal phase (group C) to the aforementioned measured surface of the oxide sintered body. In the oxide sintered body according to the present embodiment, the occupancy rate of the bixbite type phase in accordance with this definition is equal to or higher than 60%.

When the occupancy rate of the bixbite type crystal phase was equal to or higher than 60%, it was determined that the $In_2O_3$ type crystal phase which is the bixbite type crystal phase was a main component. The oxide sintered bodies in Examples 1 to 11 and Comparative Examples 1 to 10 were all mainly composed of the $In_2O_3$ type crystal phase which is the bixbite type crystal phase.

Contained amounts of In, Zn and W in the obtained oxide sintered body were measured by the ICP mass spectrometry. Based on these contained amounts, the W content rate (atomic %, denoted as "W content rate" in Table 1), the Zn content rate (atomic %, denoted as "Zn content rate" in Table 1) and the Zn/W ratio (ratio of atomic number, denoted as "Zn/W ratio" in Table 1) in the oxide sintered body were obtained. The result was shown in Table 1.

An apparent density of the obtained oxide sintered body was obtained by the Archimedes method. An electric resistivity of the obtained oxide sintered body was measured by using a resistivity meter (Loresta manufactured by Mitsubishi Yuka Co., Ltd.) in accordance with a four probe method. The obtained electric resistivity was shown in Table 1. In Comparative Example 10, without performing the calcination step (steps of 1-2 and 1-3), an $In_2O_3$ powder, a ZnO powder and a $WO_3$ powder were mixed, and were molded and sintered. Then, the electric resistivity was equal to or higher than 1 Ωcm and application to the DC (direct current) magnetron sputtering method was impossible.

TABLE 1

| | Raw Material Powders | | | | | Calcined | | Sintering |
|---|---|---|---|---|---|---|---|---|
| | Molar Mixing Ratio | | | | W Particle | Calcination | Complex | |
| | W (%) | Z (%) | I (%) | W Composition | Size μm | Temperature ° C. | Oxide Type | Temperature ° C. |
| Comparative Example 1 | 44.5 | 0.9 | 54.6 | $WO_2$ | 2.0 | 1000 | $In_6WO_{12}$ | 1190 |
| Comparative Example 2 | 38.5 | 1.3 | 60.3 | $WO_3$ | 1.4 | 750 | $ZnWO_4$ | 1180 |
| Example 1 | 3.9 | 1.9 | 94.2 | $WO_{2.72}$ | 1.0 | 1000 | $In_6WO_{12}$ | 1195 |
| Example 2 | 9.4 | 1.9 | 88.7 | $WO_3$ | 0.8 | 1000 | $In_6WO_{12}$ | 1195 |
| Example 3 | 18.0 | 1.8 | 80.2 | $WO_{2.72}$ | 0.6 | 1000 | $In_6WO_{12}$ | 1190 |
| Example 4 | 25.9 | 1.7 | 72.4 | $WO_{2.72}$ | 0.6 | 1000 | $In_6WO_{12}$ | 1190 |
| Comparative Example 3 | 33.1 | 1.7 | 65.3 | $WO_3$ | 0.6 | 1000 | $In_6WO_{12}$ | 1180 |
| Comparative Example 4 | 42.2 | 1.6 | 56.3 | $WO_3$ | 1.3 | 750 | $ZnWO_4$ | 1180 |
| Example 5 | 8.5 | 2.8 | 88.7 | $WO_{2.72}$ | 1.0 | 1000 | $In_6WO_{12}$ | 1195 |
| Example 6 | 36.3 | 2.4 | 61.3 | $WO_3$ | 0.8 | 1000 | $In_6WO_{12}$ | 1190 |
| Example 7 | 45.6 | 2.3 | 52.1 | $WO_3$ | 0.6 | 1000 | $In_6WO_{12}$ | 1180 |
| Comparative Example 5 | 50.7 | 2.2 | 47.1 | $WO_{2.72}$ | 0.8 | 750 | $ZnWO_4$ | 1180 |
| Example 8 | 27.1 | 3.4 | 69.5 | $WO_3$ | 2.0 | 1000 | $In_6WO_{12}$ | 1195 |
| Example 9 | 37.8 | 4.7 | 57.5 | $WO_2$ | 3.0 | 1000 | $In_6WO_{12}$ | 1195 |
| Example 10 | 47.1 | 5.9 | 47.1 | $WO_3$ | 4.0 | 1000 | $In_6WO_{12}$ | 1195 |
| Example 11 | 55.2 | 6.9 | 37.9 | $WO_2$ | 0.6 | 750 | $ZnWO_4$ | 1195 |
| Comparative Example 6 | 0.8 | 0.8 | 98.4 | $WO_{2.72}$ | 0.6 | 750 | $ZnWO_4$ | 1190 |
| Comparative Example 7 | 2.2 | 2.2 | 95.7 | $WO_3$ | 0.8 | 750 | $ZnWO_4$ | 1190 |

TABLE 1-continued

| | | | | | | | | |
|---|---|---|---|---|---|---|---|---|
| Comparative Example 8 | 50.7 | 8.5 | 40.8 | WO$_{2.72}$ | 1.2 | 750 | ZnWO$_4$ | 1190 |
| Comparative Example 9 | 7.7 | 0.8 | 91.6 | WO$_{2.72}$ | 5.0 | 750 | ZnWO$_4$ | 1190 |
| Comparative Example 10 | 0.8 | 0.8 | 98.4 | WO$_{2.72}$ | 1.2 | no calcination | — | 1190 |

| | Oxide Sintered Body | | | | | |
|---|---|---|---|---|---|---|
| | Apparent Density (g/cm$^3$) | Electric Resistivity (Ωcm) | W Content Rate (atomic %) | Zn Content Rate (atomic %) | Zn/W Ratio (ratio of atomic number) | Crystal Phase Present Other Than Main Component |
| Comparative Example 1 | 6.6 | 2 × 10$^{-3}$ | 0.6 | 28.8 | 48 | ZnO |
| Comparative Example 2 | 6.7 | 2 × 10$^{-3}$ | 0.8 | 24.0 | 30 | ZnO, ZnWO$_4$ |
| Example 1 | 7.0 | 1 × 10$^{-3}$ | 1.0 | 2.0 | 2 | ZnO |
| Example 2 | 6.9 | 1 × 10$^{-2}$ | 1.0 | 5.0 | 5 | ZnO |
| Example 3 | 6.9 | 8 × 10$^{-3}$ | 1.0 | 10.0 | 10 | ZnO |
| Example 4 | 6.8 | 5 × 10$^{-3}$ | 1.0 | 15.0 | 15 | ZnO |
| Comparative Example 3 | 6.8 | 4 × 10$^{-3}$ | 1.0 | 20.0 | 20 | ZnO |
| Comparative Example 4 | 6.6 | 2 × 10$^{-3}$ | 1.0 | 27.0 | 27 | ZnO, ZnWO$_4$ |
| Example 5 | 7.0 | 9 × 10$^{-3}$ | 1.5 | 4.5 | 3 | ZnO |
| Example 6 | 6.7 | 5 × 10$^{-3}$ | 1.5 | 10.0 | 7 | ZnO |
| Example 7 | 6.6 | 2 × 10$^{-3}$ | 1.5 | 16.0 | 11 | ZnO |
| Comparative Example 5 | 6.6 | 3 × 10$^{-3}$ | 1.5 | 34.5 | 23 | ZnO, ZnWO$_4$ |
| Example 8 | 6.8 | 4 × 10$^{-3}$ | 2.0 | 10.0 | 5 | ZnO |
| Example 9 | 6.8 | 5 × 10$^{-3}$ | 3.0 | 10.0 | 3 | ZnO |
| Example 10 | 6.9 | 6 × 10$^{-3}$ | 4.0 | 10.0 | 2.5 | ZnO |
| Example 11 | 6.9 | 6 × 10$^{-3}$ | 5.0 | 10.0 | 2 | ZnO, ZnWO$_4$ |
| Comparative Example 6 | 7.0 | 1 × 10$^{-1}$ | 0.4 | 0.4 | 1 | none |
| Comparative Example 7 | 7.0 | 4 × 10$^{-2}$ | 1.1 | 1.1 | 1 | none |
| Comparative Example 8 | 6.9 | 2 × 10$^{-3}$ | 6.0 | 36.0 | 6 | ZnO, ZnWO$_4$ |
| Comparative Example 9 | 6.9 | 2 × 10$^{-1}$ | 0.4 | 4.0 | 10 | ZnO |
| Comparative Example 10 | 7.0 | 40 | 0.4 | 0.4 | 1 | none |

(2) Fabrication and Evaluation of Semiconductor Device (TFT) Including Oxide Semiconductor Film (2-1) Fabrication of Semiconductor Device (TFT) Including Oxide Semiconductor Film A TFT having a configuration similar to that of semiconductor device 30 shown in FIG. 3 was fabricated in accordance with the following procedure. Referring to FIG. 4(A), a synthetic quartz glass substrate was first prepared as substrate 11, and an Mo electrode having a thickness of 100 nm was formed on substrate 11 as gate electrode 12 by the sputtering method.

Referring to FIG. 4(B), an SiO$_x$ film or an SiN$_y$ film of 200 nm in thickness, which was an amorphous oxide layer, was next formed on gate electrode 12 as gate insulating film 13 by the plasma CVD method. In the section of "GI Layer" in Table 2 below, the material of gate insulating film 13 used in each of Examples and Comparative Examples is described.

Referring to FIG. 4(C), oxide semiconductor film 14 was next formed on gate insulating film 13 by a DC (direct current) magnetron sputtering method. A plane of the target having a diameter of 3 inches (76.2 mm) was a sputtering surface. The oxide sintered body obtained in (1) above was used as the target.

Formation of oxide semiconductor film 14 will be described more specifically. Substrate 11 having aforementioned gate electrode 12 and gate insulating film 13 formed thereon was arranged on a water-cooled substrate holder in a film formation chamber of a sputtering apparatus (not shown) such that gate insulating film 13 was exposed. The aforementioned target was arranged at a distance of 90 mm to face gate insulating film 13. The degree of vacuum in the film formation chamber was set at approximately 6×10$^{-5}$ Pa and the target was sputtered as follows.

First, with a shutter interposed between gate insulating film 13 and the target, a mixed gas of an Ar (argon) gas and an O$_2$ (oxygen) gas was introduced into the film formation chamber until the pressure of 0.5 Pa was reached. A content rate of the O$_2$ gas in the mixed gas was 20 volume %. The DC electric power of 110 W was applied to the target to cause sputtering discharge, and thereby, cleaning (pre-sputtering) of the target surface was performed for 5 minutes.

Next, the DC electric power of 110 W was applied to the same target, and with the atmosphere in the film formation chamber maintained, the aforementioned shutter was removed and oxide semiconductor film 14 was formed on gate insulating film 13. A bias voltage was not particularly applied to the substrate holder. The substrate holder was water-cooled or heated and the temperature of substrate 11 during film formation and after film formation was adjusted. Of Examples and Comparative Examples, in Examples in which "during film formation" is described in the section of "Heating Treatment" in Table 2 below, the substrate holder was heated and the substrate temperature was adjusted to the temperature described in the section of "Treatment Temperature" in Table 2 during film formation, and thereby, the heating treatment was performed simultaneously with film formation. In this case, the heating treatment time corresponds to the film formation time. On the other hand, of Examples and Comparative Examples, in the case where "after film formation" is described in the section of "Heating Treatment" in Table 2 below, the substrate holder was water-cooled and the substrate temperature was adjusted to approximately 20° C. during film formation, and after film formation (specifically after formation of source electrode 15 and drain electrode 16, as described below), the substrate holder was heated and the substrate temperature was adjusted to the temperature described in the section of "Treatment Temperature" in Table 2, and thereby, the heating treatment was performed. In this case, the film formation time was about 14 seconds when the film thickness of oxide semiconductor film 14 was, for example, 5 nm (Example 11), and was about 70 seconds when the film thickness of oxide semiconductor film 14 was 28 nm (Comparative Example 1). In addition, in the case where "none" is described in the section of "Heating Treatment" in Table 2 below, the heating treatment was not performed both during film formation and after film formation. In this case, the substrate temperature during film formation was approximately 20° C. In any of Examples and Comparative Examples, the film formation time was adjusted such that the thickness of oxide semiconductor film 14 had values shown in Table 2.

As described above, oxide semiconductor film 14 was formed by the DC (direct current) magnetron sputtering method by using the target processed from the oxide sintered body obtained in (1) above. Oxide semiconductor film 14 functions as a channel layer in a TFT. The film thickness of oxide semiconductor film 14 formed in each of Examples and Comparative Examples is shown in Table 2. The film thickness of oxide semiconductor film 14 was calculated by observing a film cross section with the transmission electron microscope, measuring a distance from a lowermost surface to an uppermost surface of the film, and dividing the distance by an observation magnification. Measurement of the distance was performed at five points and the film thickness was calculated from an average value thereof.

Next, a part of oxide semiconductor film 14 thus formed was etched to form a source electrode forming portion 14s, a drain electrode forming portion 14d and a channel portion 14c. A size of a main surface of each of source electrode forming portion 14s and drain electrode forming portion 14d was set to be 50 μm×50 μm, and a channel length $C_L$ (referring to FIGS. 1(A) and 1(B), channel length $C_L$ refers to a distance of channel portion 14c between source electrode 15 and drain electrode 16) was set to be 30 μm, and a channel width $C_W$ (referring to FIGS. 1(A) and 1(B), channel width $C_W$ refers to a width of channel portion 14c) was set to be 40 μm. 25 channel portions 14c in length and 25 channel portions 14c in width were arranged at intervals of 3 mm within the substrate main surface of 75 mm×75 mm such that 25 TFTs in length and 25 TFTs in width were arranged at intervals of 3 mm within the substrate main surface of 75 mm×75 mm.

Etching of a part of oxide semiconductor film 14 was performed by preparing an etching aqueous solution including oxalic acid and water at a volume ratio of oxalic acid:water=5:95, and immersing substrate 11 having gate electrode 12, gate insulating film 13 and oxide semiconductor film 14 formed thereon in this order, in this etching aqueous solution at 40° C.

Referring to FIG. 4(D), source electrode 15 and drain electrode 16 were next formed on oxide semiconductor film 14 to be separated from each other.

Specifically, a resist (not shown) was first applied onto oxide semiconductor film 14 and was exposed and developed such that only the main surfaces of source electrode forming portion 14s and drain electrode forming portion 14d of oxide semiconductor film 14 were exposed. Next, an Mo electrode having a thickness of 100 nm as source electrode 15 and an Mo electrode having a thickness of 100 nm as drain electrode 16 were formed on the main surfaces of source electrode forming portion 14s and drain electrode forming portion 14d of oxide semiconductor film 14, respectively, by the sputtering method. Thereafter, the resist on oxide semiconductor film 14 was peeled off. As for the Mo electrode as source electrode 15 and the Mo electrode as drain electrode 16, one source electrode 15 and one drain electrode 16 were arranged for one channel portion 14c such that 25 TFTs in length and 25 TFTs in width were arranged at intervals of 3 mm within the substrate main surface of 75 mm×75 mm.

Of Examples and Comparative Examples, in the case where "after film formation" is described in the section of "Heating Treatment" in Table 2 below, the substrate holder was heated and the substrate temperature was adjusted to the temperature described in the section of "Treatment Temperature" in Table 2 after formation of source electrode 15 and drain electrode 16, and thereby, the heating treatment was performed in the air atmosphere. The heating treatment time was about 14 minutes.

Referring to FIG. 3, passivation film 18 was next formed on oxide semiconductor film 14, source electrode 15 and drain electrode 16. Passivation film 18 had a configuration obtained by forming an $SiO_x$ film of 100 nm in thickness, which was an amorphous oxide layer, by the plasma CVD method, and thereafter, forming an $SiN_y$ film of 200 nm in thickness on the $SiO_x$ film by the plasma CVD method, or a configuration obtained by forming an $Al_mO_n$ film of 100 nm in thickness, which was an amorphous oxide layer, by the sputtering method, and thereafter, forming an $SiN_y$ film of 200 nm in thickness on the $Al_mO_n$ film by the plasma CVD method. When the amorphous oxide layer is the $SiO_x$ film, "$SiO_x$" is described in the section of "PV Layer" in Table 2 below. When the amorphous oxide layer is the $Al_mO_n$ film, "$Al_mO_n$" is described in the section of "PV Layer".

Next, passivation film 18 on source electrode 15 and drain electrode 16 was etched by reactive ion etching and the contact hole was formed, and thereby, a part of the surfaces of source electrode 15 and drain electrode 16 were exposed.

Finally, annealing treatment (heat treatment) was performed in the nitrogen atmosphere. This annealing treatment was performed in all Examples and Comparative Examples. Specifically, the annealing treatment at 280° C. for 30 minutes in the nitrogen atmosphere was followed by annealing treatment at 350° C. for 30 minutes in the nitrogen atmosphere. As described above, a TFT including oxide semiconductor film 14 as a channel layer was obtained.

(2-2) Crystallinity, W Content Rate, Zn Content Rate and Zn/W Ratio of Oxide Semiconductor Film The crystallinity of oxide semiconductor film 14 of the fabricated TFT was evaluated in accordance with the aforementioned measurement method and definition. In the section of "Crystallinity" in Table 2, "nanocrystalline" is described when oxide semiconductor film 14 is nanocrystalline, and "amorphous" is described when oxide semiconductor film 14 is amorphous. In addition, the contained amounts of In, W and Zn in oxide semiconductor film 14 were measured by the RBS (Rutherford backscattering analysis). Based on these contained amounts, the W content rate (atomic %, denoted as "Zn Content Rate" in Table 1), the Zn content rate (atomic %, denoted as "Zn Content Rate" in Table 2) and the Zn/W ratio (ratio of atomic number, denoted as "Zn/W Ratio" in Table 2) in oxide semiconductor film 14 were obtained. The result is shown in Table 2.

(2-3) Measurement of Electric Resistivity

A measurement needle was brought into contact with source electrode 15 and drain electrode 13. Next, a source-drain current $I_{ds}$ was measured while changing a voltage from 1 V to 20 V and applying the voltage to between source electrode 15 and drain electrode 16. A slope when drawing a $I_{ds}$-$V_{gs}$ graph refers to a resistance R. From this resistance R as well as channel length $C_L$ (30 μm), channel width $C_W$ (40 μm) and film thickness t, the electric resistivity can be determined as $R \times C_W \times t/C_L$. It was confirmed that the oxide semiconductor films of Examples all had an electric resistivity of equal to or higher than $10^{-1}$ Ωcm.

(2-4) Evaluation of Characteristics of Semiconductor Device

The characteristics of the TFT which is semiconductor device 10 were evaluated as follows. First, a measurement needle was brought into contact with gate electrode 12, source electrode 15 and drain electrode 16. A source-drain voltage $V_{ds}$ of 0.2 V was applied to between source electrode 15 and drain electrode 16, and a source-gate voltage $V_{gs}$ applied to between source electrode 15 and gate electrode 12 was changed from −30 V to 20 V and source-drain current $I_{ds}$ at this time was measured. Then, a relationship between source-gate voltage $V_{gs}$ and a square root [$(I_{ds})^{1/2}$] of source-drain current $I_{ds}$ was graphed (hereinafter, this graph will be also referred to as "$V_{gs}$-$(I_{ds})^{1/2}$ curve"). A tangent line was drawn on the $V_{gs}$-$(I_{ds})^{1/2}$ curve, and defined as threshold voltage $V_{th}$ was an intersection point (x intercept) where the tangent line tangent to a point having the maximum slope of the tangent line intersects with the x axis ($V_{gs}$). Threshold voltage $V_{th}$ was measured for the TFT subjected to the annealing treatment at 280° C. for 30 minutes in the nitrogen atmosphere ($V_{th}$ (280° C.)) and the TFT subjected to the annealing treatment at 350° C. for 30 minutes in the nitrogen atmosphere ($V_{th}$ (350° C.)).

In addition, $g_m$ was derived by differentiating source-drain current $I_{ds}$ with respect to source-gate voltage $V_{gs}$ in accordance with the following equation [a]:

$$g_m = dI_{ds}/dV_{gs} \qquad [a].$$

Then, by using a value of $g_m$ when $V_{gs}$=15.0 V, a field-effect mobility $\mu_{fe}$ was calculated based on the following equation [b]:

$$\mu_{fe} = g_m \times C_L/(C_W \times C_i \times V_{ds}) \qquad [b].$$

In the aforementioned equation [b], channel length $C_L$ was 30 μm and channel width $C_W$ was 40 μm. In addition, capacitance $C_i$ of gate insulating film 13 was $3.4 \times 10^{-8}$ F/cm$^2$, and source-drain voltage $V_{ds}$ was 0.3 V.

Field-effect mobility $\mu_{fe}$ after the annealing treatment at 280° C. for 30 minutes in the nitrogen atmosphere is described in the section of "Mobility (280° C.)" in Table 2. Field-effect mobility $\mu_{fe}$ after the annealing treatment at 350° C. for 30 minutes in the nitrogen atmosphere is described in the section of "Mobility (350° C.)" in Table 2. As shown in Table 2, it is seen that as the Zn/W ratio becomes higher, a difference between the mobility (280° C.) and the mobility (350° C.) becomes smaller. In addition, when the In/(In+Zn) ratio is higher than 0.8, field-effect mobility $\mu_{fe}$ of the TFT subjected to the annealing treatment at 280° C. is high.

Furthermore, the following reliability evaluation test was performed. With source-gate voltage $V_{gs}$ applied to between source electrode 15 and gate electrode 12 being fixed to −25 V, application of this source-gate voltage $V_{gs}$ was continued for 1 hour. By using the aforementioned method, threshold voltage $V_{th}$ was obtained 1 second, 10 seconds, 100 seconds, 300 seconds, and 3600 seconds after the start of application, and a difference $\Delta V_{th}$ between maximum threshold voltage $V_{th}$ and minimum threshold voltage $V_{th}$ was obtained. It is determined that as $\Delta V_{th}$ becomes smaller, the reliability becomes higher. $\Delta V_{th}$ after the annealing treatment at 280° C. for 30 minutes in the nitrogen atmosphere is described in the section of "$\Delta V_{th}$ (280° C.)" in Table 2. $\Delta V_{th}$ after the annealing treatment at 350° C. for 30 minutes in the nitrogen atmosphere is described in the section of "$\Delta V_{th}$ (350° C.)" in Table 2.

TABLE 2

| | | Oxide Semiconductor Film | | | | Formation of Oxide Semiconductor Film | | |
|---|---|---|---|---|---|---|---|---|
| | | W Content | Zn Content | Zn/W Ratio | | | | |
| | Crystallinity | Rate (atomic %) | Rate (atomic %) | (ratio of atomic number) | Film Thickness (nm) | Heating Treatment | Treatment Temperature (° C.) | GI Layer |
| Comparative Example 1 | amorphous | 0.6 | 26.0 | 43 | 28 | after film formation | 100 | SiO$x$ |
| Comparative Example 2 | amorphous | 0.8 | 22.0 | 27.5 | 15 | during film formation | 100 | SiN$y$ |
| Example 1 | nanocrystalline | 1.0 | 2.0 | 2 | 10 | none | — | SiO$x$ |
| Example 2 | amorphous | 1.0 | 5.0 | 5 | 10 | none | — | SiO$x$ |
| Example 3 | amorphous | 1.0 | 10.0 | 10 | 10 | none | — | SiO$x$ |
| Example 4 | amorphous | 1.0 | 18.0 | 18 | 10 | none | — | SiO$x$ |
| Comparative Example 3 | amorphous | 1.0 | 20.0 | 20 | 10 | none | — | SiO$x$ |
| Comparative Example 4 | amorphous | 1.0 | 30.0 | 30 | 10 | none | — | SiO$x$ |
| Example 5 | amorphous | 1.5 | 4.0 | 2.7 | 11 | after film formation | 150 | SiO$x$ |
| Example 6 | amorphous | 1.5 | 21.0 | 14 | 11 | after film formation | 150 | SiO$x$ |

TABLE 2-continued

| | | | | | | | | |
|---|---|---|---|---|---|---|---|---|
| Example 7 | amorphous | 1.5 | 18.0 | 12 | 11 | after film formation | 150 | SiOx |
| Comparative Example 5 | amorphous | 1.5 | 31.0 | 20.7 | 11 | after film formation | 150 | SiOx |
| Example 8 | amorphous | 2.0 | 14.0 | 7 | 15 | after film formation | 150 | SiOx |
| Example 9 | amorphous | 3.0 | 13.0 | 4.3 | 12 | after film formation | 150 | SiOx |
| Example 10 | amorphous | 4.0 | 29.0 | 7.3 | 9 | during film formation | 200 | SiNy |
| Example 11 | amorphous | 5.0 | 9.0 | 1.8 | 5 | after film formation | 250 | SiOx |
| Comparative Example 6 | nanocrystalline | 0.4 | 0.4 | 1 | 10 | after film formation | 150 | SiOx |
| Comparative Example 7 | nanocrystalline | 1.1 | 1.0 | 0.9 | 27 | after film formation | 150 | SiOx |
| Comparative Example 8 | amorphous | 6.0 | 32.4 | 5.4 | 10 | after film formation | 150 | SiOx |
| Comparative Example 9 | amorphous | 0.4 | 3.5 | 8.75 | 10 | after film formation | 150 | SiOx |

| | | Evaluation of Characteristics | | | | | |
|---|---|---|---|---|---|---|---|
| | PV Layer | Mobility (280° C.) (cm²/Vs) | Mobility (350° C.) | $V_{th}$ (280° C.) (V) | $V_{th}$ (350° C.) | $\Delta V_{th}$ (280° C.) (V) | $\Delta V_{th}$ (350° C.) |
| Comparative Example 1 | AlmOn | 31 | 29 | 1.4 | 1.7 | 0.14 | 0.06 |
| Comparative Example 2 | SiNy | 30 | 29 | 1.8 | 2.1 | 0.14 | 0.06 |
| Example 1 | AlmOn | 43 | 26 | 2.0 | 2.3 | 0.12 | 0.03 |
| Example 2 | AlmOn | 41 | 28 | 2.0 | 2.3 | 0.12 | 0.03 |
| Example 3 | AlmOn | 38 | 37 | 2.0 | 2.3 | 0.12 | 0.03 |
| Example 4 | AlmOn | 36 | 36 | 2.2 | 2.5 | 0.12 | 0.03 |
| Comparative Example 3 | AlmOn | 30 | 30 | 2.4 | 2.7 | 0.12 | 0.03 |
| Comparative Example 4 | AlmOn | 28 | 27 | 2.5 | 2.8 | 0.12 | 0.03 |
| Example 5 | SiOx | 34 | 24 | 2.5 | 2.8 | 0.12 | 0.02 |
| Example 6 | SiOx | 28 | 27 | 2.6 | 2.9 | 0.12 | 0.02 |
| Example 7 | SiOx | 32 | 31 | 2.7 | 3.0 | 0.12 | 0.02 |
| Comparative Example 5 | SiOx | 25 | 24 | 3.0 | 3.3 | 0.12 | 0.02 |
| Example 8 | AlmOn | 31 | 30 | 3.2 | 3.5 | 0.12 | 0.03 |
| Example 9 | AlmOn | 30 | 29 | 3.5 | 3.8 | 0.12 | 0.03 |
| Example 10 | SiNy | 28 | 28 | 3.7 | 4.0 | 0.12 | 0.03 |
| Example 11 | AlmOn | 29 | 28 | 4.0 | 4.3 | 0.12 | 0.03 |
| Comparative Example 6 | AlmOn | 55 | 2 | −5.0 | −4.0 | 0.34 | 0.23 |
| Comparative Example 7 | AlmOn | 47 | 8 | 0.1 | 0.3 | 0.12 | 0.03 |
| Comparative Example 8 | AlmOn | 5 | 4 | 6.0 | 6.3 | 0.12 | 0.03 |
| Comparative Example 9 | AlmOn | 50 | 1 | −4.0 | −3.0 | 0.24 | 0.18 |

It should be understood that the embodiments disclosed herein are illustrative and non-restrictive in every respect. The scope of the present invention is defined by the terms of the claims, rather than the embodiments above, and is intended to include any modifications within the meaning and scope equivalent to the terms of the claims.

REFERENCE SIGNS LIST 10, 20, 30 semiconductor device (TFT), 11 substrate, 12 gate electrode, 13 gate insulating film, 14 oxide semiconductor film, 14c channel portion, 14d drain electrode forming portion, 14s source electrode forming portion, 15 source electrode, 16 drain electrode, 17 etching stopper layer, 17a contact hole, 18 passivation film.

The invention claimed is:
1. An oxide sintered body comprising indium, tungsten and zinc, wherein
the oxide sintered body includes a bixbite type crystal phase as a main component, and further includes a zinc tungstate compound crystal phase,
the oxide sintered body has an apparent density of higher than 6.6 g/cm3 and equal to or lower than 7.5 g/cm³,
a content rate of tungsten to a total of indium, tungsten and zinc in the oxide sintered body is higher than 0.5 atomic % and equal to or lower than 5.0 atomic %, a content rate of zinc to the total of indium, tungsten and zinc in the oxide sintered body is equal to or higher than 1.2 atomic % and equal to or lower than 19 atomic %, and an atomic ratio of zinc to tungsten is higher than 1.0 and lower than 60.

2. A sputtering target comprising the oxide sintered body as recited in claim 1.

* * * * *